(12) United States Patent  
Miyata et al.

(10) Patent No.: US 7,696,047 B2
(45) Date of Patent: Apr. 13, 2010

(54) METHOD FOR EVALUATING A GATE INSULATION FILM CHARACTERISTIC FOR USE IN A SEMICONDUCTOR DEVICE

(75) Inventors: Masayasu Miyata, Suwa (JP); Masamitsu Uehara, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/183,704

(22) Filed: Jul. 31, 2008

(65) Prior Publication Data
US 2008/0293170 A1 Nov. 27, 2008

Related U.S. Application Data

(62) Division of application No. 10/583,180, filed as application No. PCT/JP2004/019467 on Dec. 17, 2004, now abandoned.

(30) Foreign Application Priority Data
Dec. 18, 2003 (JP) ............................. 2003-421655
Jul. 27, 2004 (JP) ............................. 2004-219192

(51) Int. Cl.
*H01L 21/8234* (2006.01)
*H01L 21/336* (2006.01)
(52) U.S. Cl. ..................... 438/275; 438/287; 438/308; 257/E21.033
(58) Field of Classification Search ................ 438/275, 438/287, 308; 257/E21.033
See application file for complete search history.

(56) References Cited

U.S. PATENT DOCUMENTS 5,972,765 A  10/1999  Clark et al.

(Continued)

FOREIGN PATENT DOCUMENTS

EP  0 892 424 A  1/1999

(Continued)

OTHER PUBLICATIONS

G. D. Wilk et. al., 'Stable zirconium silicate gate dielectrics deposited directly on silicon', Allied Physics Letters, vol. 76, No. 1, Jan. 3, 2000.

(Continued)

*Primary Examiner*—Ngan Ngo
(74) *Attorney, Agent, or Firm*—Harness, Dickey & Pierce, P.L.C.

(57) ABSTRACT

A gate insulating film 3 is formed of an insulative inorganic material containing silicon and oxygen as a main material. The gate insulating film 3 contains hydrogen atoms. A part of the absorbance of infrared radiation of which wave number is in the range of 830 to 900 cm$^{-1}$ is less than both the absorbance of infrared radiation at the wave number of 830 cm$^{-1}$ and the absorbance of infrared radiation at the wave number of 900 cm$^{-1}$ when the insulating film to which an electric field has never been applied is measured by means of Fourier Transform Infrared Spectroscopy at room temperature. Further, in the case where the absolute value of the difference between the absorbance of infrared radiation at the wave number of 830 cm$^{-1}$ and the absorbance of infrared radiation at the wave number of 770 cm$^{-1}$ is defined as A and the absolute value of the difference between the absorbance of infrared radiation at the wave number of 900 cm$^{-1}$ and the absorbance of infrared radiation at the wave number of 990 cm$^{-1}$ is defined as B, then A and B satisfy the relation: A/B is 1.8 or more.

9 Claims, 13 Drawing Sheets

U.S. PATENT DOCUMENTS

| | | |
|---|---|---|
| 6,208,002 B1 | 3/2001 | Satake et al. |
| 6,323,098 B1 | 11/2001 | Ogata et al. |
| 6,444,533 B1 | 9/2002 | Lyding et al. |
| 6,548,426 B1 | 4/2003 | Suzuki et al. |
| 6,774,038 B2 | 8/2004 | Rhee et al. |
| 7,238,557 B2 * | 7/2007 | Hayakawa ............... 438/161 |
| 7,579,661 B2 * | 8/2009 | Miyata et al. ............ 257/410 |
| 2002/0047169 A1 | 4/2002 | Kunikiyo |
| 2002/0072180 A1 | 6/2002 | Yugami et al. |
| 2002/0140043 A1 | 10/2002 | Mitani et al. |
| 2002/0180991 A1 | 12/2002 | Takoudis et al. |
| 2003/0185980 A1 | 10/2003 | Endo |
| 2003/0219935 A1 * | 11/2003 | Miyairi et al. ........... 438/166 |
| 2003/0219950 A1 | 11/2003 | Lyding et al. |
| 2004/0101977 A1 * | 5/2004 | Celinska et al. ............. 438/3 |
| 2005/0269639 A1 * | 12/2005 | Yamazaki et al. ......... 257/350 |

FOREIGN PATENT DOCUMENTS

| | | |
|---|---|---|
| JP | 10-223628 | 8/1998 |
| JP | 11-87712 | 3/1999 |
| JP | 2000-150803 | 5/2000 |
| JP | 2001-77105 | 3/2001 |
| JP | 2001-148381 | 5/2001 |
| JP | 2002-53960 | 2/2002 |
| JP | 2002/299612 A | 10/2002 |
| JP | 2002-343800 | 11/2002 |
| JP | 2003-297814 | 10/2003 |
| JP | 2003-335791 | 11/2003 |
| JP | 2003-347297 | 12/2003 |
| WO | 2005/050743 A | 6/2005 |

OTHER PUBLICATIONS

M. Quevedo-Lopez et. al., 'Hafnium interdiffusion studies from hafnium silicate into silicon', Applied Physics Letters, vol. 79, No. 25, Dec. 17, 2001.

G. D. Wilk et al., 'Electrical properties of hafnium silicate gate dielectrics deposited directly on silicon', Applied Physics Letters, vol. 74, No. 19, May 10, 1999.

Shin-ichi Saito et. al., 'Inversion Electron Mobility Affected by Phase Separation in High-Permittivity Gate Dielectrics', Jpn. J. Appl. Phys., vol. 42 (2003) pp. L1425-L1428, Part 2, No. 12A, Dec. 1, 2003.

International Search Report for PCT/JP2004/019467, dated Aug. 15, 2005; ISA/EP.

* cited by examiner

METHOD FOR EVALUATING A GATE INSULATION FILM CHARACTERISTIC FOR USE IN A SEMICONDUCTOR DEVICE

This application is a divisional of U.S. patent application Ser No. 10/583,180 filed on Jun. 16, 2006 now abandoned, which is a National Phase of PCT/JP2004/019467 filed Dec. 17, 2004. This application claims priority to Japanese Patent Applications No. 2003-421655 filed Dec. 18, 2003 and No. 2004-219192 filed Jul. 27, 2004, which are hereby expressly incorporated by reference herein in their entirety.

TECHNICAL FIELD

The present invention relates to a semiconductor device, an electronic device and an electronic apparatus.

BACKGROUND ART

Recently, in devices including semiconductor integrated circuits, in order to improve high integration thereof, the size of each element tends to become miniaturization increasingly. In a Metal Oxide Semiconductor Field Effect Transistor (MOSFET), for example, the thickness of a gate insulating film (gate insulator) becomes less than 10 nm, and therefore it is difficult to ensure resistance to a dielectric breakdown of the insulating film.

The dielectric breakdown of a gate insulating film includes a Time Zero Dielectric Breakdown (TZDB) and a time-dependent dielectric breakdown (TDDB). The TZDB is an initial failure of the gate insulating film, and means a dielectric breakdown in which a large leakage current flows in the insulating film at the moment of applying an electric stress such as a voltage stress, a current stress or the like. On the other hand, the TDDB is a phenomenon in which a dielectric breakdown occurs in the gate insulating film when some time has passed since the application of an electric stress, not at the time point when the electric stress is applied to the gate insulating film.

Further, the TDDB is classified into a hard breakdown (HBD) and a soft breakdown (SBD). The HBD is a well-known dielectric breakdown, and a large leakage current flows in an insulating film after breakdown. On the other hand, the SBD is a state at which a leakage current flows more than at an initial insulating state, but less than at the time after the HBD occurs.

The HBD is a dielectric breakdown that occurs when a relatively high electric stress is applied to an insulating film. Once a leakage current flows when the HBD occurs, an insulating property thereof is never recovered even though the insulating film is left without application of an electric stress thereto thereafter. On the other hand, the SBD is a dielectric breakdown that often occurs when a low electric stress is applied thereto. There is a case in which an insulating property thereof is recovered if the insulating film is left without application of an electric stress thereto after a leakage current occurred. Therefore, a MOSFET in which a SBD occurs may function as a semiconductor device (semiconductor element) although an insulating property thereof becomes unstable. Further, there is a possibility that the SBD shifts to the HBD as time goes by.

In addition, there is a low electric field leakage current referred to as a stress-induced leakage current (SILC) as deterioration after application of the electric stress. The SILC attracts attention as a precursor of the TDDB in addition to its effect on an insulating film to increase a leakage current. In this regard, each of the SILC and SBD still has many unclear points even though various examinations have been carried out. The SBD is also referred to as "B-mode SILC", and thus the distinction between the SILC and the SBD is unclear.

In these deterioration modes of the insulating film, the SBD and SILC particularly become problems in thinning a gate insulating film. In the case where the thickness of the gate insulating film (gate oxidized film) is 10 nm or less, the deterioration frequently occurs in the low electric field intensity range of 10 MV/cm or less (that is, in the low voltage range in which the electric field intensity is in the range of 10 MV/cm or less), and this becomes major cause that prevent a gate insulating film from being thinned.

For example, Japanese Laid-Open Patent Application No. 2002-299612 discloses an insulating film (gate insulating film) of a semiconductor device in which density of hydrogen atoms is reduced to a predetermined value in order to prevent the occurrence of the SILC. However, the above-mentioned patent application focuses on prevention of occurrence of the SILC, and as a result, the occurrence of the SBD is not examined and discussed in this application. In this regard, each of hydrogen atoms in the insulating film exists at a state of molecular hydrogen or at a connected state to any one of constituent elements of the insulating film. However, this patent application only defines the total amount of hydrogen atoms. According to consideration of the present inventors, it is understood that it is difficult to prevent the occurrence of SBD only by reducing the total amount of hydrogen atoms in the insulating film.

DISCLOSURE OF INVENTION

It is therefore an object of the present invention to provide a semiconductor device including an insulating film that can prevent SBD or SILC from occurring even in the case of thinning the insulating film and have high resistance to a dielectric breakdown such as SILC, TZDB, or TDDB (that is, that can improve insulating properties to SILC, TZDB, or TDDB). It is another object of the present invention to provide a highly reliable electronic device and electronic apparatus that include the above-mentioned semiconductor device.

In order to achieve the above object, in one aspect of the present invention, the present invention is directed to a semiconductor device including an insulating film. The insulating film is formed of an insulative inorganic material as a main material, and the insulative inorganic material contains silicon and at oxygen. The insulating film further contains hydrogen atoms. The semiconductor device has a feature that at least a part of the absorbance of infrared radiation of which wave number is in the range of 830 to 900 cm$^{-1}$ is less than both the absorbance of infrared radiation at the wave number of 830 cm$^{-1}$ and the absorbance of infrared radiation at the wave number of 900 cm$^{-1}$ when the insulating film to which an electric field has never been applied is measured by means of Fourier Transform Infrared Spectroscopy at room temperature, and that, in the case where the absolute value of the difference between the absorbance of infrared radiation at the wave number of 830 cm$^{-1}$ and the absorbance of infrared radiation at the wave number of 770 cm$^{-1}$ is defined as A and the absolute value of the difference between the absorbance of infrared radiation at the wave number of 900 cm$^{-1}$ and the absorbance of infrared radiation at the wave number of 990 cm$^{-1}$ is defined as B, then A and B satisfy the relation: A/B is 1.8 or more.

This makes it possible to prevent SBD or SILC from occurring even in the case of thinning the insulating film and to have high resistance to a dielectric breakdown such as SILC, TZDB, or TDDB (that is, it is possible to improve insulating properties to SILC, TZDB, or TDDB).

In the semiconductor device of the present invention, it is preferable that the insulative inorganic material further includes at least one of nitrogen, hafnium, zirconium, and aluminum in addition to silicon and oxygen.

This makes it possible to improve compactness, stability and dielectric constant of the insulating film.

In the semiconductor device of the present invention, it is preferable that each hydrogen atom in at least a part of the hydrogen atoms is replaced by a deuterium atom.

This makes it possible to improve resistance to a dielectric breakdown of the insulating film.

In the semiconductor device of the present invention, it is preferable that the average thickness of the insulating film is 10 nm or less.

According to the present invention, it is possible to remarkably improve resistance to a dielectric breakdown of the insulating film having a film thickness in the range described above.

In the semiconductor device of the present invention, it is preferable that the semiconductor device includes a gate electrode and a gate insulating film for insulating the gate electrode, and the gate insulating film is formed from the insulating film.

This makes it possible to prevent a dielectric breakdown of the gate insulating film, and therefore it is possible to improve the characteristics of the semiconductor device of the present invention.

In the semiconductor device of the present invention, it is preferable that the semiconductor device is adapted to be used under the condition that a gate voltage is applied to the gate electrode so that the electric field intensity in the insulating film is 10 MV/cm or less.

According to the present invention, it is possible to remarkably improve resistance to a dielectric breakdown of the insulating film in the semiconductor device to be used under such an applied voltage.

In the semiconductor device of the present invention, it is preferable that a leakage current passing through the gate insulating film in the thickness direction thereof that is measured in a state that the gate voltage is applied to the gate electrode so that the electric field intensity in the insulating film is 5 MV/cm or less is $9 \times 10^{-9}$ A/cm$^2$ or less.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a soft breakdown occurs in the insulating film is 40 C/cm$^2$ or more.

This makes it possible to further prevent a dielectric breakdown of the gate insulating film when the semiconductor device of the present invention is used.

In the semiconductor device of the present invention, it is preferable that the total amount of electrical charges passing through the gate insulating film in the thickness direction thereof until a hard breakdown occurs in the insulating film is 100 C/cm$^2$ or more.

This makes it possible, to further prevent a dielectric breakdown of the gate insulating film when the semiconductor device of the present invention is used.

In the semiconductor device of the present invention, it is preferable that the Fourier Transform Infrared Spectroscopy is Multi-Reflection Attenuated Total Reflection Method.

This makes it possible to measure the absorbance of infrared radiation with high sensitivity.

Further, in another aspect of the present invention, the present invention is directed to an electronic device. The electronic device of the present invention includes the semiconductor device described above.

This makes it possible to obtain an electronic device having high reliability.

Moreover, in yet another aspect of the present invention, the present invention is directed to an electronic apparatus. The electronic apparatus of the present invention includes the electronic device described above.

This makes it possible to obtain an electronic apparatus having high reliability.

BRIEF DESCRIPTION OF DRAWINGS

The above and other objects, features, and the advantages of the invention will readily become more apparent from the following detailed description of preferred embodiments of the invention with reference to the accompanying drawings.

BEST MODE FOR CARRYING OUT THE INVENTION

Hereinafter, a semiconductor device, an electronic device and an electronic apparatus of the present invention will now be described with respect to preferred embodiments thereof. In this regard, a semiconductor device of the present invention has a feature in an insulating film that is applied to a gate insulating film of the semiconductor device.

<Semiconductor Device>

First, a semiconductor device of the present invention will now be described.

Figure 1:
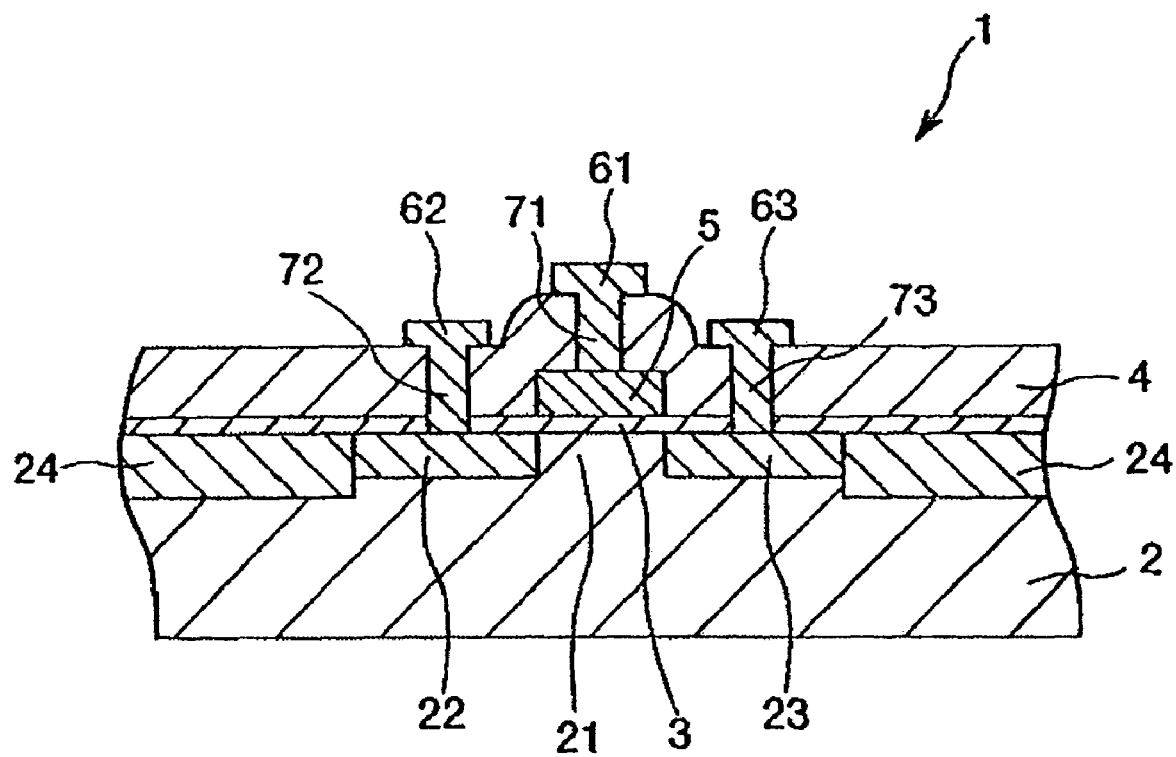
FIG. 1 is a longitudinal cross sectional view which shows a semiconductor device including an insulating film in one embodiment according to the present invention.
Figure 2:
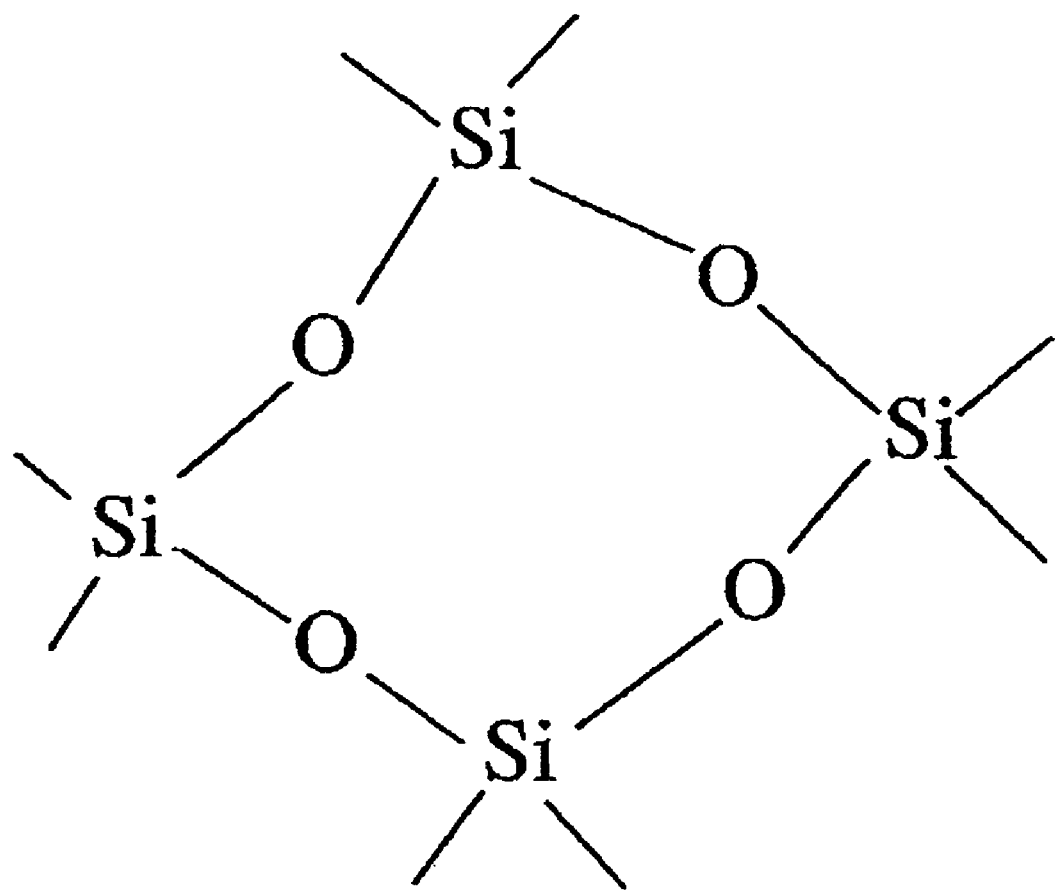
FIG. 2 is a schematic view which shows a molecular structure of the insulating film.
Figure 3:
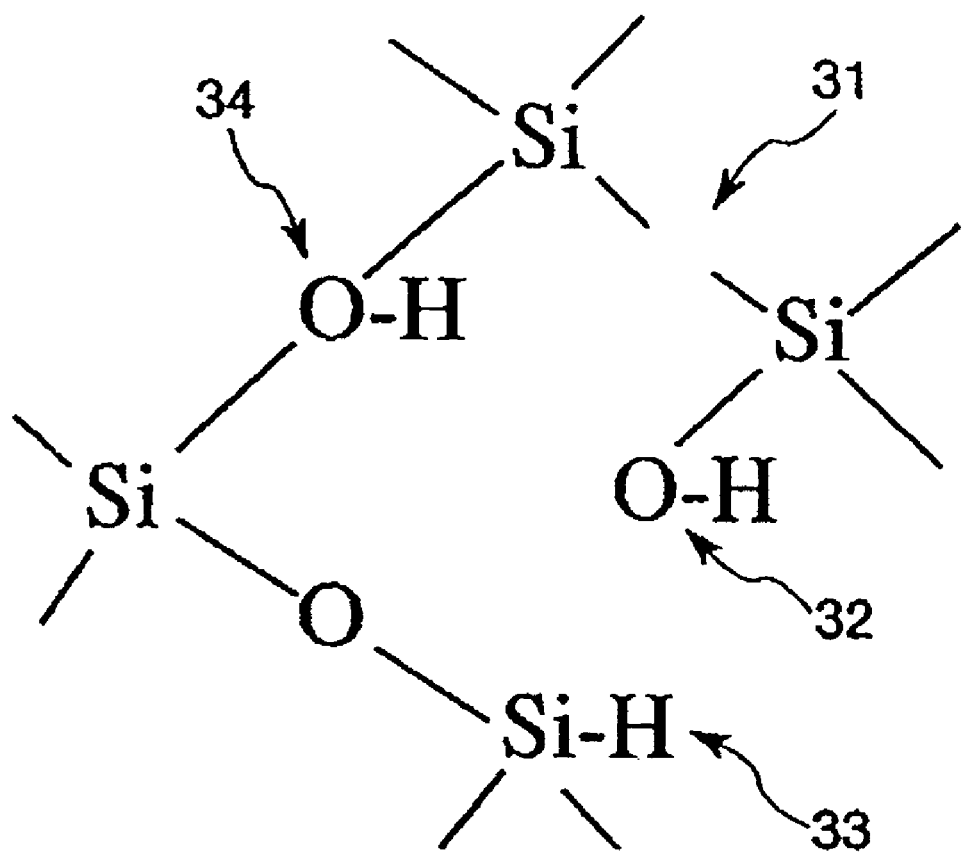
FIG. 3 is a schematic view which shows a molecular structure of the insulating film.

FIG. 1 is a longitudinal cross sectional view which shows a semiconductor device including an insulating film in one embodiment according to the present invention. FIGS. 2 and 3 are schematic views each of which shows a molecular structure of the insulating film. Now, in following explanations using FIG. 1, for convenience of explanation, an upper side and lower side in FIG. 1 are referred to as "upper" and "lower", respectively.

A semiconductor device 1 shown in FIG. 1 includes a semiconductor substrate 2, a gate insulating film 3 provided so as to cover the semiconductor substrate 2, and an interlayer insulating film 4. The semiconductor substrate 2 includes an element separate structure 24, a channel region 21, a source region 22, and a drain region 23. The semiconductor device 1 further includes a gate electrode 5 provided so as to face the channel region 21 via the gate insulating film 3, a conductive portion 61 provided on the interlayer insulating film 4 and above the gate electrode 5, a conductive portion 62 provided on the interlayer insulating film 4 and above the source region 22 and functioning as a source electrode, a conductive portion 63 provided on the interlayer insulating film 4 and above the drain region 23 and functioning as a drain electrode, a contact plug 71 which electrically connects the gate electrode 5 to the conductive portion 61, a contact plug 72 which electrically connects the source region 22 to the conductive portion 62, and a contact plug 73 which electrically connects the drain region 23 to the conductive portion 63.

The semiconductor substrate 2 is formed of a semiconducting material including, for example, silicon such as polycrystalline silicon, amorphous silicon, or the like, germanium, gallium arsenide. As described above, the semiconductor substrate 2 has the element separate structure 24, and the channel region 21, the source region 22, and the drain region 23 are provided in regions compartmented by the element separate structure 24.

Further, in the semiconductor substrate 2, the source region 22 is formed at one side portion of the channel region 21, while the drain region 23 is formed at the other side portion of the channel region 21. The element separate structure 24 is constructed so that an insulating material such as $SiO_2$ is embedded in a trench. This makes it possible to separate adjacent elements electrically, and therefore it is possible to prevent interference between adjacent elements.

The channel region 21 is formed of an intrinsic semiconductor, for example. Each of the source region 22 and the drain region 23 are formed of a semiconductor material in which an intrinsic semiconductor is doped with an n-type impurity such as $P^+$ (phosphorus ion), for example. It should be noted that each of the channel region 21, the source region 22 and the drain region 23 is not limited thereto. For example, each of the source region 22 and the drain region 23 may be constituted so as to be formed of a semiconducting material in which an intrinsic semiconductor is doped with a p-type impurity. Further, the channel region 21 may be constituted so as to be formed of a semiconducting material in which an intrinsic semiconductor is doped with a p-type or n-type impurity.

Such a semiconductor substrate 2 is covered with an insulating film (that is, the gate insulating film 3 and the interlayer insulating film 4). The portion of the insulating film (the gate insulating film 3) that is sandwiched between the channel region 21 and the gate electrode 5 serves as a channel of an electric field generated between the channel region 21 and the gate electrode 5.

The semiconductor device of this embodiment has a feature in the structure of this gate insulating film 3. This point (feature) will be described later in detail.

The constituent material of the interlayer insulating film 4 is not particularly limited, and for example, silicon system compound such as $SiO_2$, TEOS (ethyl silicate), poly-silazane can be used as the constituent material of the interlayer insulating film 4. In addition, the interlayer insulating film 4 can be formed of any one of various resin materials, various ceramics materials and the like, for example. The conductive portions 61, 62 and 63 are provided on the interlayer insulating film 4. As described above, the conductive portion 61 is formed above the channel region 21, and the conductive portions 62, 63 are formed above the source region 22 and the drain region 23, respectively.

Further, in the gate insulating film 3 and the interlayer insulating film 4, a hole portion (contact hole) communicated to the gate electrode 5, a hole portion communicated to the source region 21, and a hole portion communicated to the drain region 23 are formed in the region where the channel region 21, the source region 22, and the drain region 23 are formed, respectively. The contact plugs 71, 72 and 73 are provided in these hole portions, respectively.

The conductive portion 61 is connected to the gate electrode 5 via the contact plug 71. The conductive portion 62 is connected to the source region 22 via the contact plug 72. The conductive portion 63 is connected to the drain region 23 via the contact plug 73.

Next, a structure of the gate insulating film 3 will now be described. In the present invention, the gate insulating film 3 is formed of an insulative inorganic material containing silicon and oxygen as a main material. The gate insulating film 3 further contains hydrogen atoms.

The insulating film 3 of the present invention has a feature that at least a part of the absorbance of infrared radiation of which wave number is in the range of 830 to 900 $cm^{-1}$ is less than both the absorbance of infrared radiation at the wave number of 830 $cm^{-1}$ and the absorbance of infrared radiation at the wave number of 900 $cm^{-1}$ when the insulating film 3 to which an electric field has never been applied is measured by means of Fourier Transform Infrared Spectroscopy at room temperature, and that, in the case where the absolute value of the difference between the absorbance of infrared radiation at the wave number of 830 $cm^{-1}$ and the absorbance of infrared radiation at the wave number of 770 $cm^{-1}$ is defined as A and the absolute value of the difference between the absorbance of infrared radiation at the wave number of 900 $cm^{-1}$ and the absorbance of infrared radiation at the wave number of 990 $cm^{-1}$ is defined as B, then A and B satisfy the relation: A/B is 1.8 or more.

In this regard, the absorbance % is a value represented as log $(I_0/I)$ when incident light intensity and transmitted light intensity are defined as $I_0$ and I. The absorbance of the infrared radiation changes in proportion to the amount of particular structures of atomic groups that reside in the gate insulating film 3.

Hereinafter, with respect to this point, the case where the gate insulating film 3 is constructed from a $SiO_2$ film that is made from silicon oxide ($SiO_z$, $0<Z\leqq2$: that is, SiO and $SiO_2$) as a main material will be specifically described as one example.

More specifically, as shown in FIG. 2, the $SiO_2$ film is constructed from substantially complete three-dimension network of Si—O bonding formed by coordinating one silicon atom with four oxygen atoms as well as by coordinating one oxygen atom with two silicon atoms. The $SiO_2$ film is in an amorphous state at which the directionality of bonding becomes disorganized. When the $SiO_2$ film is formed by means of a thermal oxidation method, a CVD (Chemical Vapor Deposition) method or the like as described later, hydrogen atoms inevitably come to be mixed in the inside of the SiO$_2$ film due to gases existing in the atmosphere which includes molecular hydrogen and hydrogen atom.

As shown in FIG. 3, hydrogen atoms exist in the inside of the SiO$_2$ film as a Si—OH structure 32 or a Si—H structure 33 as well as molecular hydrogen (H$_2$). In this case, any of the hydrogen atoms respectively react with Si—O bonding structures or incomplete coordinate structures 31 to form the Si—OH structure 32 and the Si—H structure 33, and as a result, they have an impact on an electronic structure (electronic state) of the constituent material of the gate insulating film 3.

The inventors of the present invention persevered in examination and found that a Si—OH structure 34 in which one oxygen atom is coordinated with three other atoms (in FIG. 3, two Si atoms and one H atom) by means of first principle electronic structure simulation. In addition, the inventors found that dielectric breakdown occurs with high frequency due to an electric stress that occurs by mutual influence (interaction) of the Si—OH structure 34 and the OSiO structure. As a result, the inventors found that the larger the interaction of the Si—OH structure 34 and the OSiO structure is (that is, the more the Si—OH structures 34 exist in the gate insulating film 3), the more a leakage current flows over the gate insulating film 3 (the more easily the TZDB occurs).

On the other hand, the inventors confirmed that the Si—OH structure 32 or the Si—H structure 33 does not contribute a current because these structures stably exist in the gate insulating film 3.

Further, the inventors found that the Si—OH structures 34 are susceptible to an external electric field and stabilized by the external electric field to be increased, and as a result a leakage current due to the electric stress (that is, SILC) may be increased, by which a generation mechanism of the SBD can be explained. Then, the inventors found that the HBD tends to occur as these results.

In this regard, the extent that the mutual influence (interaction) of the Si—OH, structure 34 and the OSiO structure can be confirmed by detecting (measuring) bending vibration of these structures using Fourier Transform Infrared Spectroscopy, for example. It is known that the absorption of the infrared radiation derived from the bending vibration of the Si—OH structure 34 and the OSiO structure specifically occurs when the wave number of the infrared radiation is in the range of 750 to 1000 cm$^{-1}$.

In the SiO$_2$ film, the infrared absorption spectrum when the wave number of the infrared radiation is in the range of 750 to 1000 cm$^{-1}$ changes in response to the ratio of existence of the Si—OH structure 34 and the OSiO structure and the extent of the interaction thereof. Here, an example of the infrared absorption spectrum when the wave number of the infrared radiation is in the range of 750 to 1000 cm$^{-1}$ of the SiO$^2$ film is shown in FIG. 4.

Figure 4:
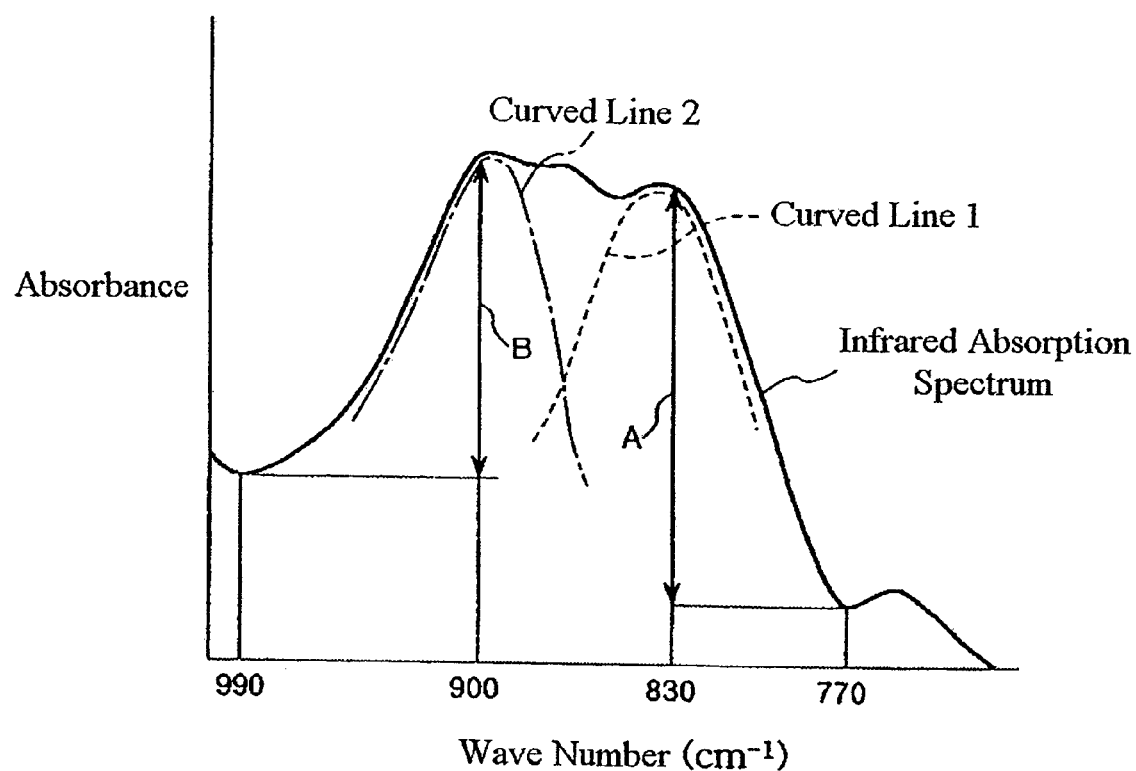
FIG. 4 is a drawing which shows an example of an infrared absorption spectrum obtained from a SiO$_2$ film.

As shown in FIG. 4, the infrared absorption spectrum is detected as a complicated pattern in which a curved line 1 having a peak at about 830 cm$^{-1}$ and a curved line 2 having a peak at about 900 cm$^{-1}$ overlap and a part of the absorbance of infrared radiation of which wave number is in the range of 830 to 900 cm$^{-1}$ (more specifically, the absorbance of infrared radiation of which wave number is in the range of 840 to 860 cm$^{-1}$) is less than the absorbance of infrared radiation at the wave number of 830 cm$^{-3}$. In this regard, although the case where a part of the absorbance of infrared radiation of which wave number is in the range of 830 to 900 cm$^{-1}$ is less than the absorbance of infrared radiation at the wave number of 830 cm$^{-1}$ is shown in FIG. 4, the infrared absorption spectrum may have a pattern in which the part of the absorbance of infrared radiation is less than the absorbance of infrared radiation at the wave number of 900 cm$^{-1}$.

The inventors further found that it is possible to prevent the SBD from occurring in the SiO$_2$ film effectively if the two curved lines 1, 2 satisfy a predetermined relation, more specifically, as shown in FIG. 4, if A and B satisfy the relation: A/B is 1.8 or more in the case where the absolute value of the difference between the absorbance of infrared radiation at the wave number of 830 cm$^{-1}$ and the absorbance of infrared radiation at the wave number of 770 cm$^{-1}$ is defined as A and the absolute value of the difference between the absorbance of infrared radiation at the wave number of 900 cm$^{-1}$ and the absorbance of infrared radiation at the wave number of 990 cm$^{-1}$ is defined as B.

Moreover, as mentioned above, the inventors found that the amount of Si—OH structures 34 is increased in response to intensity and time of an electric stress. Thus, the inventors found that the less the amount of Si—OH structures 34 is in the gate insulating film 3 to which electric stress has never been applied (that is, the less the extent of the mutual influence of the Si—OH structure 34 and OSiO structure is), the superior resistance to a dielectric breakdown the gate insulating film 3 has.

For this reason, such a SiO$_2$ film (insulating film) in which A and B satisfy the relation: A/B is 1.8 or more when the insulating film to which an electric field has never been applied is measured by means of Fourier Transform Infrared Spectroscopy at room temperature has superior resistance to a dielectric breakdown because it is difficult for the SILC, TZDB, SBD, or HBD to occur in the SiO$_2$ film. Namely, almost gate insulating films 3 can pass general dielectric breakdown test (that is, TZDB or TDDB test) when testing the gate insulating films 3 having the absorbance in this range.

Further, a semiconductor device 1 in which such a SiO$_2$ film is applied to a gate insulating film thereof can obtain stable characteristics and durability performance. In this regard, in order to evaluate resistance to a dielectric breakdown of an insulating film, a large numbers of tests must be repeated to obtain statistical data and it takes long time and the cost for carrying out the tests is increased. Further, of course, the insulating film after test cannot be utilized as a product because insulation of the insulating film is destroyed.

Correspondingly, a method of using the absorbance of infrared radiation as the present invention is a versatile method (evaluation method) because this method is easy to be carried out and does not require much time and many costs, and can determine dielectric breakdown characteristics of the insulating film without influence on the insulating film (in non-destructive method). Here, when specifying the relationship of the absorbance of infrared radiation corresponding to the extent of the mutual influence (interaction) of the Si—OH structures 34 and the OSiO structure (in the present invention, A/B is 1.8 or more), an insulating film (SiO$_2$ film) is one to which an electric stress has never been applied, and specifying the absorbance of infrared radiation when measured at room temperature (ordinary temperature) under the condition that stress is not applied to the insulating film during the measurement makes clear the correspondence to experimental results (the absorbance of infrared radiation measured in the insulating film and the value of A/B obtained from the absorbance), and is most appropriate.

In this regard, as described above, A and B may satisfy the relation: A/B is 1.8 or more. However, it is preferable that A/B is 2.0 or more, and more preferably it is 2.2 or more. This makes it possible to prevent a dielectric breakdown (such as SBD, SILC) of the gate insulating film 3 (SiO$_2$ film) more surely. Further, in general, the dielectric breakdown of the gate insulating film 3 tends to occur due to frequent usage (frequent application of voltage to the gate electrode 5). However, by restricting the relationship of A/B within the range described above, the amount of Si—OH structures 34 is controlled within an appropriate range even though the semiconductor device 1 has been used frequently. This makes it possible to prevent a dielectric breakdown of the gate insulating film 3 more surely.

The constituent material (insulative inorganic material) of the gate insulating film 3 as described above is not limited to one formed from silicon oxide as a main material, and the gate insulating film 3 may contain other element (atoms of other element) other than silicon and oxygen. It is preferable that the other element includes at least one of nitrogen, hafnium, zirconium, and aluminum. By containing nitrogen atoms, it is possible to improve compactness of the gate insulating film 3, for example. Further, by containing nitrogen, hafnium, zirconium, or aluminum, it is possible to improve the stability of the gate insulating film 3 and dielectric constant of the gate insulating film 3, for example.

A method of forming the gate insulating film 3 described above will be described later as well as a method of manufacturing the semiconductor device 1.

Each hydrogen atom in at least a part of the hydrogen atoms in the gate insulating film 3 may be replaced by deuterium atom. This makes it possible to further reduce instable structures to an external electric field (the structures in which a hydrogen atom is bonded to the element other than silicon in the constituent elements of the insulative inorganic material). As a result, it is possible to improve resistance to a dielectric breakdown of the gate insulating film 3.

It is preferable that the average thickness of the gate insulating film 3 (the average film thickness) is 10 nm or less, and more preferably it is in the range of about 1 to 7 nm. By restricting the thickness of the gate insulating film 3 within the above range, it is possible to make the semiconductor device 1 smaller sufficiently. Further, the SBD tends to occur frequently in particular when the thickness of the gate insulating film 3 is made thinner as the range described above. Thus, by applying the present invention to the gate insulating film 3 having such a thinner film thickness, it is possible to exert an effect of the present invention prominently.

It is preferable that Multi-Reflection Attenuated Total Reflection (ATR) Method is in particular utilized in the Fourier Transform Infrared Spectroscopy to measure the absorbance of infrared radiation. The Multi-Reflection Attenuated Total Reflection Method is a method of detecting the reflected light after infrared radiation is repeatedly total-reflected onto a surface of the sample to be measured, and has some advantages including (1) the yield of light is high because the infrared radiation is total-reflected, (2) it is possible to obtain high sensitivity of the reflected light because a signal (a signal of the reflected light) is amplified by multi-reflection.

Further, it is preferable that the semiconductor device 1 is adapted to be used under the condition that a gate voltage is applied to the gate electrode 5 so that the electric field intensity in the gate insulating film 3 is 10 MV/cm or less. More preferably the electric field intensity in the gate insulating film 3 is 5 MV/cm or less. The SILC or SBD tends to occur in the range of the above-mentioned electric field intensity. However, in the case of the gate insulating film 3 that is used at such electric field intensity, by applying the present invention it is possible to achieve the effect to prevent the SILC or SBD from occurring noticeably.

In this regard, there is a fear that an irreversible dielectric breakdown (that is, HBD) occurs when higher electric field intensity over the upper limit described above is applied to the gate electrode 5.

Moreover, it is preferable that a leakage current passing through the gate insulating film 3 in the thickness direction thereof that is measured in a state that the gate voltage is applied to the gate electrode 5 so that the electric field intensity in the insulating film is 5 MV/cm or less is $9 \times 10^{-9}$ A/cm$^2$ or less. More preferably the leakage current is $5 \times 10^{-9}$ A/cm$^2$ or less. By satisfying such a condition in the gate insulating film 3 it is difficult for a dielectric breakdown of the gate insulating film 3 to occur when the semiconductor device 1 is used.

Furthermore, in the case where the time point at which a small voltage change is initially generated is the SBD (soft breakdown) by supplying a constant current to the gate insulating film 3, it is preferable that the total amount of electric charges passing through the gate insulating film 3 in the thickness direction thereof until a soft breakdown (SBD) occurs in the gate insulating film 3 is 40 C/cm$^2$ or more. More preferably the total amount of the electric charges is 75 C/cm$^2$ or more. By satisfying such a condition in the gate insulating film 3, it is difficult for a dielectric breakdown of the gate insulating film 3 to occur when the semiconductor device 1 is used.

Further, in the case where the time point at which a drastic voltage change is generated is the HBD (hard breakdown), it is preferable that the total amount of electric charges passing through the gate insulating film 3 in the thickness direction thereof until a hard breakdown (HBD) occurs in gate the insulating film 3 is 100 C/cm$^2$ or more. More preferably the total amount of electric charges is 200 C/cm$^2$ or more. By satisfying such a condition in the gate insulating film 3, it is difficult for a dielectric breakdown of the gate insulating film 3 to occur when the semiconductor device 1 is used.

The structure of the semiconductor device 1 of the present invention including the gate insulating film 3 has been described on the basis of preferred embodiment shown in FIGS. 1-3, but such an insulating film having a feature described above can be applied to the interlayer insulating film 4 in the semiconductor device 1 of the present invention.

<Method of Manufacturing Semiconductor Device>

Next, a method of manufacturing the semiconductor device shown in FIG. 1 will now be described. FIG. 5A-5H are longitudinal cross sectional views for explaining a method of manufacturing the semiconductor device shown in FIG. 1. Now, in following explanations using FIGS. 5A-5H, for convenience of explanation, an upper side and lower side in FIGS. 5A-5H are referred to as "upper" and "lower", respectively.

Figure 5A:
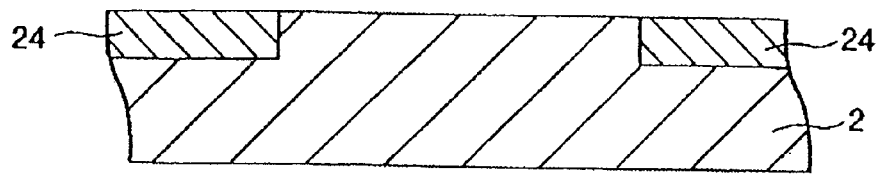
FIGS. 5A-5H are longitudinal cross sectional views for explaining a method of manufacturing the semiconductor device shown in FIG. 1.

<1> As shown in FIG. 5A, a trench element separate structure 24 is formed on the surface of a semiconductor substrate 2 by means of Local Oxidation of Silicon (LOCOS) method or the like. Thus, element forming regions are compartmented on the surface of the semiconductor substrate 2.

<2> Next, a well is formed by carrying out ion doping onto the semiconductor substrate 2. For example, in the case of forming a p-well, p-type impurities such as B$^+$ ions or the like are doped into the semiconductor substrate 2, while in the case of forming an n-well, n-type impurities such as P$^+$ ions or the like are doped into the semiconductor substrate 2.

Figure 5B:
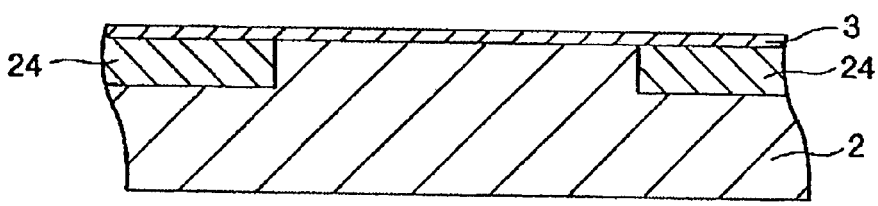

<3> Next, as shown in FIG. 5B, a gate insulating film 3 is formed on the semiconductor substrate 2.

I: Silicon Oxide Film

In the case where a silicon oxide ($SiO_2$) film is formed as a gate insulating film 3, a thermal oxidation method, a CVD (Chemical Vapor Deposition) method or the like can be utilized, for example.

I-1: Thermal Oxidation Method

The thermal oxidation method is a method of forming a silicon oxide film on the surface of the silicon substrate (the semiconductor substrate 2) by supplying a gas containing oxygen atoms onto the silicon substrate heated. It is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes, and more preferably it is in the range of about 20 to 60 minutes. Further, as the gas containing oxygen atoms, for example molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms.

I-2: CVD Method

The CVD method is a method of forming a silicon oxide film on the surface of the silicon substrate (the semiconductor substrate 2) by introducing a gas containing precursors to silicon oxide and oxygen atoms in a chamber to which a constant pressure is applied and heating the silicon substrate (the semiconductor substrate 2). As the precursors to silicon oxide, dichlorosilane, hexachloro disilanete, trakis(hydrocarbyl-amino)silane, tris(hydrocarbyl-amino)silane, and the like may be mentioned. One kind of these or combination of two or more kinds of these can be utilized as the precursors to silicon oxide.

As the gas containing oxygen atoms, for example, molecule oxygen (pure oxygen), ozone, hydrogen peroxide, water vapor, nitrogen monoxide, nitrogen dioxide, dinitrogen oxide, or the like may be mentioned. One kind of these or combination of two or more kinds of these can be utilized as the gas containing oxygen atoms. Further, it is preferable that the heating temperature is in the range of about 300 to 1,000° C., and more preferably it is in the range of about 500 to 800° C.

Since the heating time may be appropriately set according to the desired thickness of the silicon oxide film, the heating time is not particularly limited. For example, in the case where the heating temperature is set to be in the above range, it is preferable that the heating time is in the range of about 10 to 90 minutes and more preferably it is in the range of about 20 to 60 minutes. Moreover, it is preferable that the pressure (degree of vacuum) in the chamber is in the range of about 0.05 (6.67 Pa) to 760 Torr (that is, atmosphere pressure, $1.013 \times 10^5$ Pa), and more preferably it is in the range of about 0.1 (13.3 Pa) to 500 Torr ($6.67 \times 10^5$ Pa). Furthermore, it is preferable that a mixture ratio (mole ratio) of precursors to silicon oxide to a gas containing oxygen atoms is in the range of about 10:1 to 1:100, and more preferably it is in the range of about 1:2 to 1:10.

II: Silicon Oxynitride Film

In the case where a silicon oxynitride (SiON) film is formed as a gate insulating film 3, for example, the silicon oxynitride (SiON) film can be formed using a mixture gas of a gas containing oxygen atoms and a gas containing nitrogen atoms in place of a gas containing oxygen atoms in the CVD (Chemical Vapor Deposition) method described in I-2. As the gas containing nitrogen atoms, for example, ammonia, hydrazine, alkyl hydrazine compound, hydrogen azide, nitrogen monoxide, nitrogen dioxide, dinitrogen oxide, or the like may be mentioned. One kind of these or combination of two or more kinds of these can be utilized as the gas containing nitrogen atoms. In addition, the silicon oxynitride (SiON) film can be obtained by applying heat treatment to a silicon oxide film in the atmosphere including nitrogen gases ($N_2$), for example.

III: Hafnium Silicate Film, Zirconium Silicate Film, and Aluminum Silicate Film

In the case where a hafnium silicate (HfSiO) film, a zirconium silicate (ZrSiO) film, or an aluminum silicate (AlSiO) film is formed as a gate insulating film 3, a CVD (Chemical Vapor Deposition) method, a PVD method (Physical Vapor Deposition such as a vacuum evaporation method), a spattering method or the like can be utilized, for example.

Further, by mixing two or more compounds each constituting the insulating film as the gate insulating film 3 (that is, the silicon oxide film, silicon oxynitride film, hafnium silicate film, zirconium silicate film, and aluminum silicate film) and carrying out one method (herein, spattering method) or two or more methods described above, it is possible to form the gate insulating film 3 constituted from multiple compounds. Moreover, for example, heat treatment or the like may be applied to the obtained gate insulating film 3 in the atmosphere including water vapor ($H_2O$). In this case, it is preferable that the heating temperature is in the range of about 500 to 1,200° C., and more preferably it is in the range of about 700 to 1,000° C.

In the case where the heating temperature is set to be in the above range, it is preferable that the heating time is in the range of about 10 to 90 minutes, and more preferably it is in the range of about 20 to 60 minutes. Further, it is preferable that the relative humidity of the atmosphere is in the range of about 50 to 100% RH, and more preferably it is in the range of about 75 to 100% RH. By forming the gate insulating film 3 with the method and conditions described above, it is possible to prevent interfusion of hydrogen atoms. This makes it possible to reduce the existing amount of Si—OH structures extremely, and as a result, it is possible to prevent the interaction of the Si—OH structure and the OSiO structure from occurring. Further, it is possible to satisfy the relation described above (that is, A/B is 1.8 or more) more surely in the obtained gate insulating film 3.

In this regard, as a method of replacing each of hydrogen atoms in the gate insulating film 3 with a deuterium atom, for example, (A) a method of applying heat treatment to the gate insulating film 3 in the atmosphere including deuterium gas ($D_2$) after forming the gate insulating film 3; (B) a method of applying thermal oxidation to the semiconductor substrate 2 in the atmosphere including heavy water vapor ($D_2O$) when forming the gate insulating film 3; (C) a method of applying heat treatment to the gate insulating film 3 in the atmosphere including deuterated ammonia ($ND_3$) after forming the gate insulating film 3; or the like may be mentioned. One kind of these methods or combination of two or more kinds of these methods can be utilized as the method of replacing each of hydrogen atoms in the gate insulating film 3 with a deuterium atom.

Figure 5C:
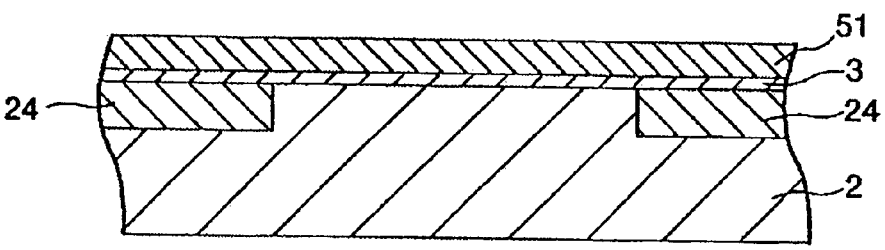

<4> Next, as shown in FIG. 5C, a conductive film 51 is formed on the gate insulating film 3. The conductive film 51 can be formed by depositing polycrystalline silicon or the like on the gate insulating film 3 with the CVD method, for example.

Figure 5D:
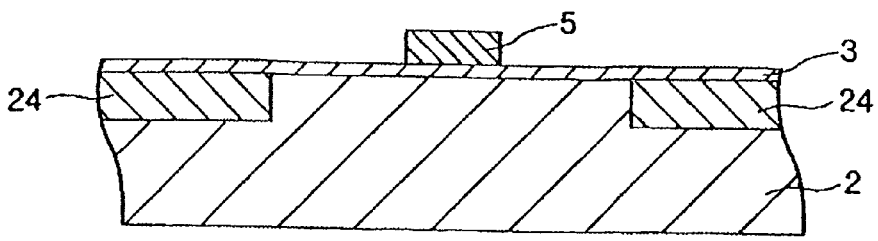

<5> Next, a resist mask corresponding to the shape of the gate insulating film 3 is formed on the conductive film 51 with a photolithography method or the like, for example. Then, unwanted portions of the conductive film 51 are eliminated via the resist mask with etching. Thus, it is possible to obtain the gate electrode 5 as shown in FIG. 5D. As this etching, physical etching method such as plasma etching, reactive etching, beam etching, photo assisted etching, chemical etching method such as wet etching, or the like may be mentioned. Further, One kind of these etching methods or combination of two or more kinds of these etching methods can be utilized as the etching.

Figure 5E:
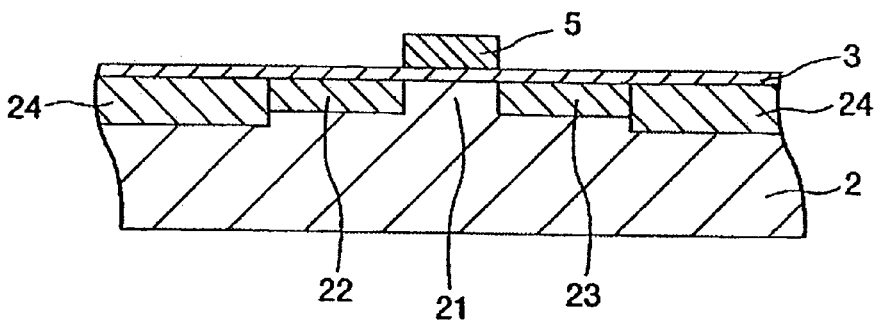

<6> Next, as shown in FIG. 5E, the source region 22 and the drain region 23 are formed by carrying out ion doping into both sides of the gate electrode 5 in the semiconductor substrate 2. At this time, in the case of forming the well with p-type impurities, the source region 22 and the drain region 23 are formed by doping n-type impurities such as $P^+$ into the both sides of the gate electrode 5. On the other hand, in the case of forming the well with n-type impurities, the source region 22 and the drain region 23 are formed by doping p-type impurities such as $B^+$ into the both sides of the gate electrode 5.

Figure 5F:
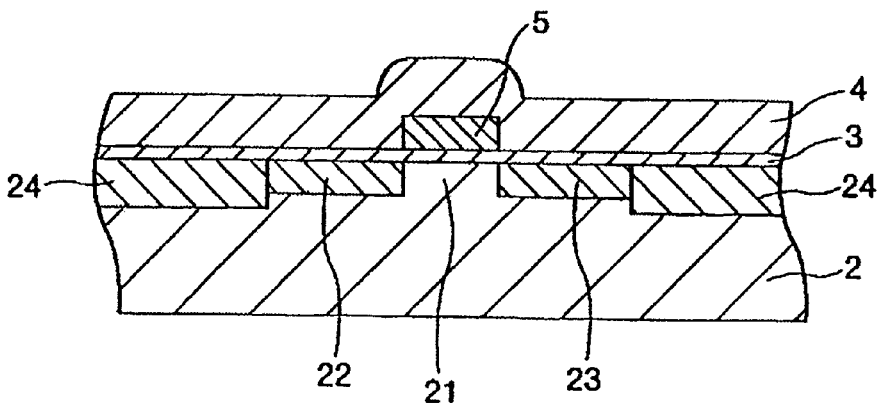

<7> Next, as shown in FIG. 5F, the interlayer insulating film 4 is formed by depositing $SiO_2$ or the like on the semiconductor substrate 2 on which the respective portions are formed with a CVD method or the like.

Figure 5G:
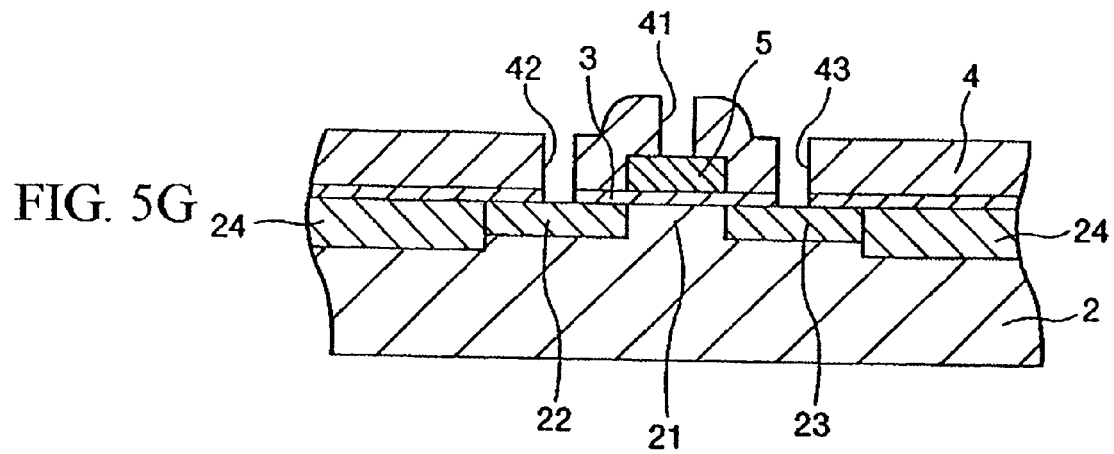

<8> Next, a resist mask in which portions corresponding to the contact holes opens is formed on the interlayer insulating film 4 with a photolithography method or the like, for example. Then, unwanted portions of the interlayer insulating film 4 are eliminated via the resist mask with etching. Thus, as shown in FIG. 5G, the contact holes 41, 42, and 43 are formed so as to correspond to the channel region 21, the source region 22, and the drain region 23, respectively.

<9> Next, a conductive film is formed by depositing a conductive material on the interlayer insulating film 4 including the insides of the contact holes 41, 42, and 43 with a CVD method or the like, for example.

Figure 5H:
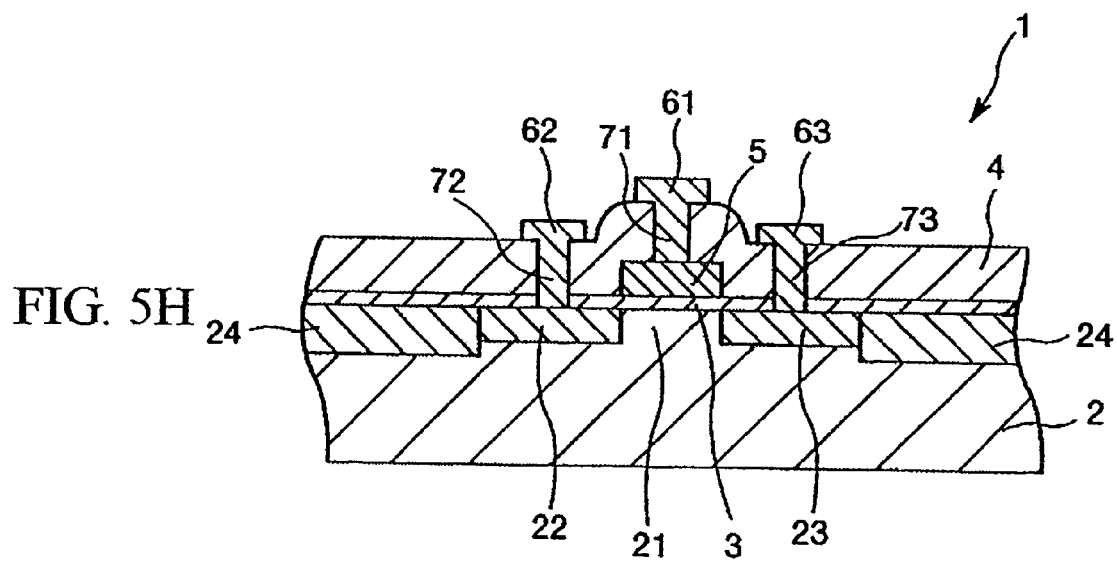

<10> Next, a resist mask corresponding to the shape of the conductive portion is formed on the conductive film with a photolithography method or the like, for example. Then, unwanted portions of the conductive film are eliminated via the resist mask with etching. Thus, as shown in FIG. 5H, the conductive portions 61, 62, and 63 and the contact plugs 71, 72, and 73 are formed so as to correspond to the channel region 21, the source region 22, and the drain region 23, respectively.

Through the steps described above, the semiconductor device 1 is manufactured.

<Electronic Device>

The semiconductor device 1 described above is applied to various types of electronic devices. Hereinafter, a case where an electronic device of the present invention including the semiconductor device 1 of the present invention is applied to a transmission liquid crystal display (LCD) will now be described as a representative example.

Figure 6:
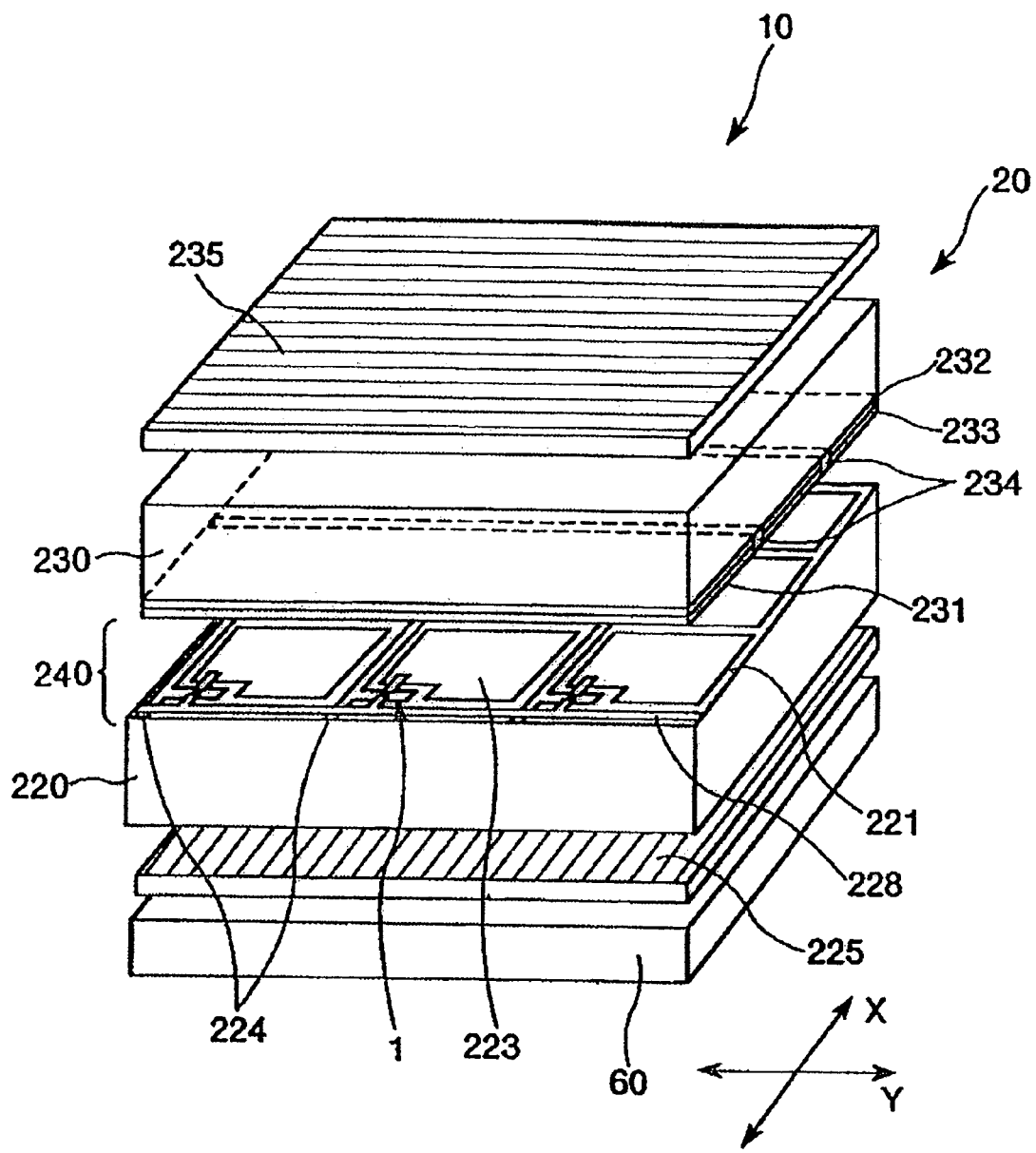
FIG. 6 is an exploded perspective view which shows an embodiment of an electronic device in the case of applying an electronic device of the present invention to a transmission liquid crystal display.

FIG. 6 is an exploded perspective view which shows an embodiment of an electronic device in the case of applying an electronic device of the present invention to a transmission liquid crystal display. In this regard, some members (components) of the transmission LCD in FIG. 6 are omitted in order to avoid complication of the drawings. Further, in following explanations using FIG. 6, for convenience of explanation, an upper side and lower side in FIG. 6 are referred to as "upper" and "lower", respectively.

This transmission liquid crystal display 10 shown in FIG. 5 (hereinafter, the transmission liquid crystal display 10 will be referred to as simply "liquid crystal display 10") includes a liquid crystal panel (display panel) 20, and a backlight (light source) 60. The liquid crystal display 10 can display an image (information) by transmitting light from the backlight 60 to the liquid crystal panel 20.

The liquid crystal panel 20 has a first plate 220 and a second plate 230 that are provided so as to face each other. Further, a seal member (not shown) is provided between the first and second plate 220, 230 so that a display area is surrounded by the seal member. A liquid crystal that is an electro-optical material is received in a space defined by the first plate 220, the second plate 230, and the seal member, thereby forming a liquid crystal layer (intermediary layer) 240. Namely, the liquid crystal layer 240 is inserted between the first plate 220 and the second plate 230.

Although illustrative representation is omitted, an orientational film constituted from polyimide, for example, is provided on each of upper and lower surfaces of the liquid crystal layer 240. Orientation (orientational direction) of liquid crystal molecules constituting the liquid crystal layer 240 is controlled by these orientational films. Each of the first plate 220 and the second plate 230 is formed of one of various kinds of glass materials, various kinds of resin materials, and the like, for example.

The first plate 220 is provided with a plurality of picture electrodes 223 arranged in a matrix manner on the top surface 221 thereof (that is, the surface facing the liquid crystal layer 240), scanning lines 224 each extending in an X direction of FIG. 5, and signal lines 228 each extending in a Y direction of FIG. 5. Each of the picture electrodes 223 is constituted from a transparent conductive film having transparency (optical transparency), and connected to one scanning line 224 and one signal line 228 via one semiconductor device (that is, a semiconductor device of the present invention) 1. A polarizing plate 225 is provided on the lower surface of the first plate 220.

On the other hand, the second plate 220 is provided with opposing electrodes 232 constituted from a plurality of strip on the lower surface 231 thereof (that is, the surface facing the liquid crystal layer 240). These opposing electrodes 232 are arranged in substantially parallel to each other so as to space by a predetermined distance each other and to face the picture electrode 223. A portion where the picture electrode 223 and the opposing electrode 232 are overlapped each other (which includes an adjacent portion) constitutes one pixel. By charging and discharging between the picture electrode 223 and the opposing electrode 232, in every pixel, the liquid crystal of the liquid crystal layer 240 is driven, that is, a orientational state of the liquid crystal is changed.

The opposing electrode 232 is also constituted from a transparent conductive film having transparency (optical transparency) as well as the picture electrode 223. Each of three colored layers including red (R), green (G) and blue (B) (color filter) 233 is provided on the lower surface of each of the opposing electrodes 232. These colored layers 233 are divided by a black matrix 234.

The black matrix 234 has a light blocking effect, and is formed of, for example, a metal such as chromium, aluminum, aluminum alloy, nickel, zinc, titanium, or a resin in which carbon or the like is dispersed. Further, a polarizing plate 235 of which the deflecting axis different from that of the polarizing plate 225 is provided on the upper surface of the second plate 230.

In the liquid crystal panel 20 having such a structure, light emitting from the backlight 60 enters the liquid crystal layer 240 through the first plate 220 and the picture electrodes 223 after deflected with the polarizing plate 225. The intensity of the light entering the liquid crystal layer 240 is modulated with the liquid crystal in which orientational state of each of pixel is controlled. The intensity-modulated light passes through the colored layer 233, the opposing electrodes 232 and the second plate 230, and then deflected with the polarizing plate 235 to exit outside the liquid crystal display 10. Thus, in the liquid crystal display 10, it is possible to view a color image (including both a moving image and a still image) such as letter, numeric character, and figure (graphic form) from the opposite side to the liquid crystal layer 240 of the second plate 230.

In this regard, in the explanation described above, a case where the electronic device of the present invention is applied to an active matrix driving type of transmission liquid crystal device has been described as a representative example. However, the present invention is not limited thereto. In addition, it is possible to apply the electronic device of the present invention to a reflective liquid crystal display, organic or inorganic electroluminescence display, and an electrophoretic display.

<Electronic Apparatus>

The liquid crystal display 10 described above (electronic device of the present invention) can be utilized as a display portion of each of various types of electronic apparatuses.

Figure 7:
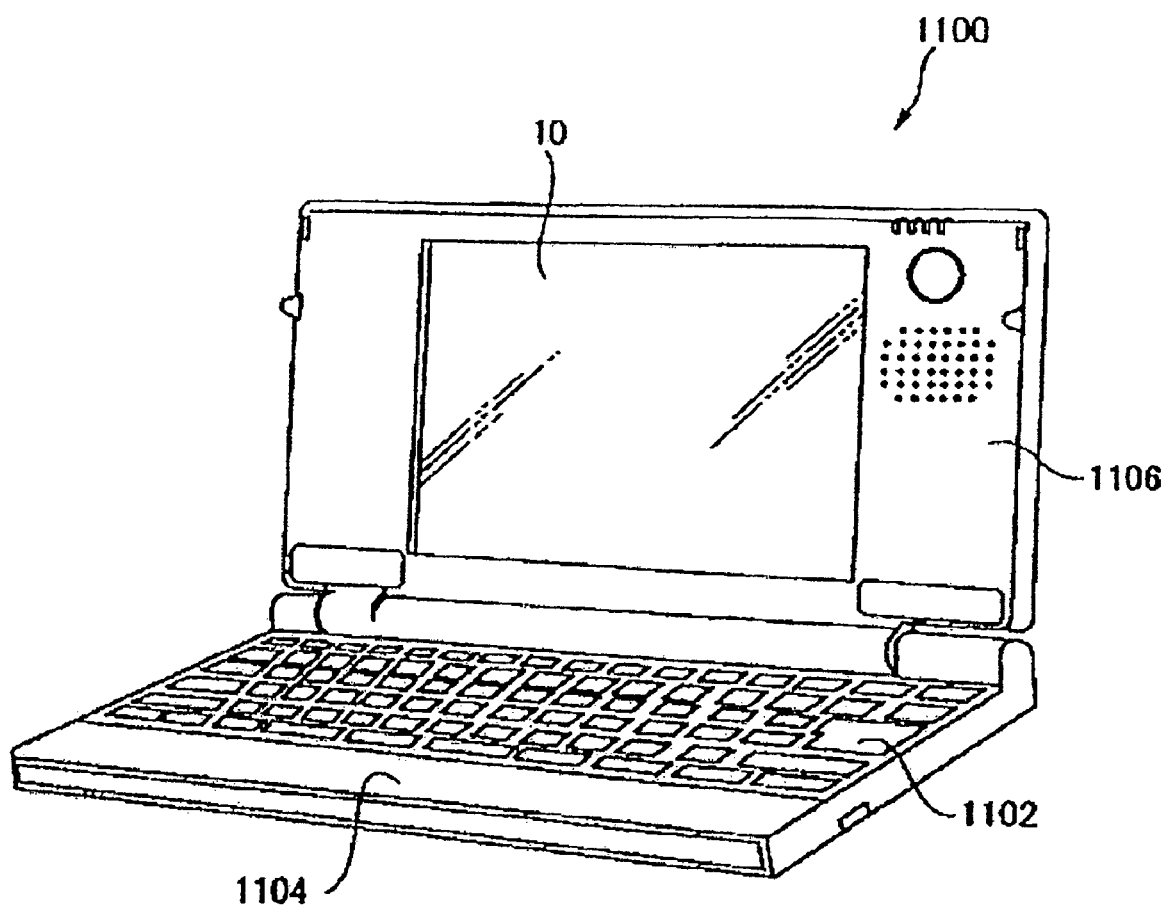
FIG. 7 is a perspective view which shows a structure of a mobile (or laptop type) personal computer to which an electronic apparatus of the present invention is applied.

FIG. 7 is a perspective view which shows a structure of a mobile (or laptop type) personal computer to which an electronic apparatus of the present invention is applied. Referring to FIG. 7, a personal computer 1100 is provided with a body 1104 having a keyboard 1102, and a display unit 1106. The display unit 1106 is rotatably supported on the body 1104 via a hinge portion. In this personal computer, 1100, the display unit 1106 is provided with the liquid crystal display (electro-optical device) 10 described above.

Figure 8:
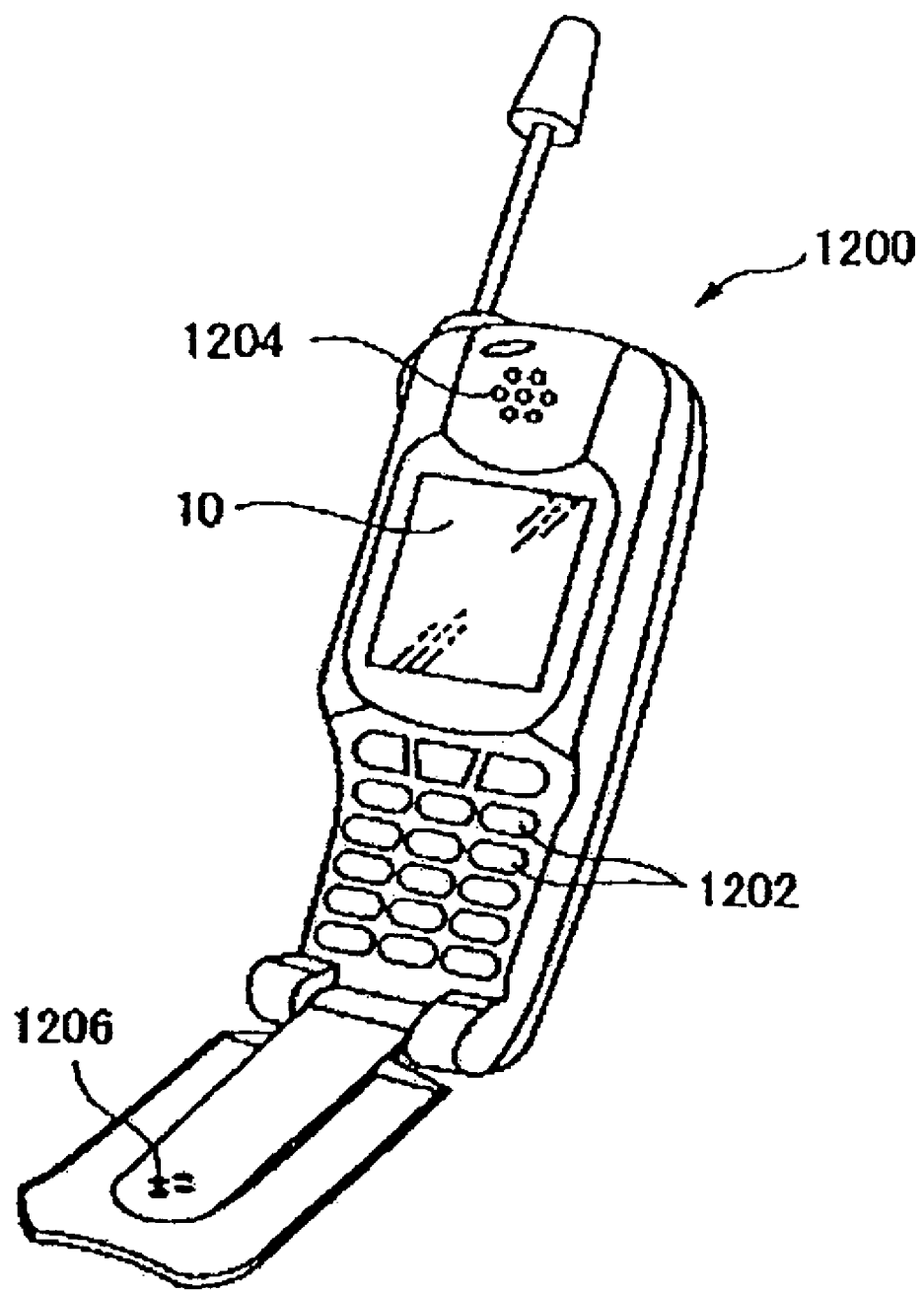
FIG. 8 is a perspective view which shows a structure of a portable phone (including a personal handyphone system) to which an electronic apparatus of the present invention is applied.

FIG. 8 is a perspective view which shows a structure of a portable phone (including a personal handyphone system) to which an electronic apparatus of the present invention is applied. Referring to FIG. 8, a portable phone 1200 is provided with a plurality of buttons 1202, an earpiece 1204, a mouthpiece 1206, and a display portion. The display portion is constituted from the liquid crystal display (electro-optical device) 10 described above.

Figure 9:
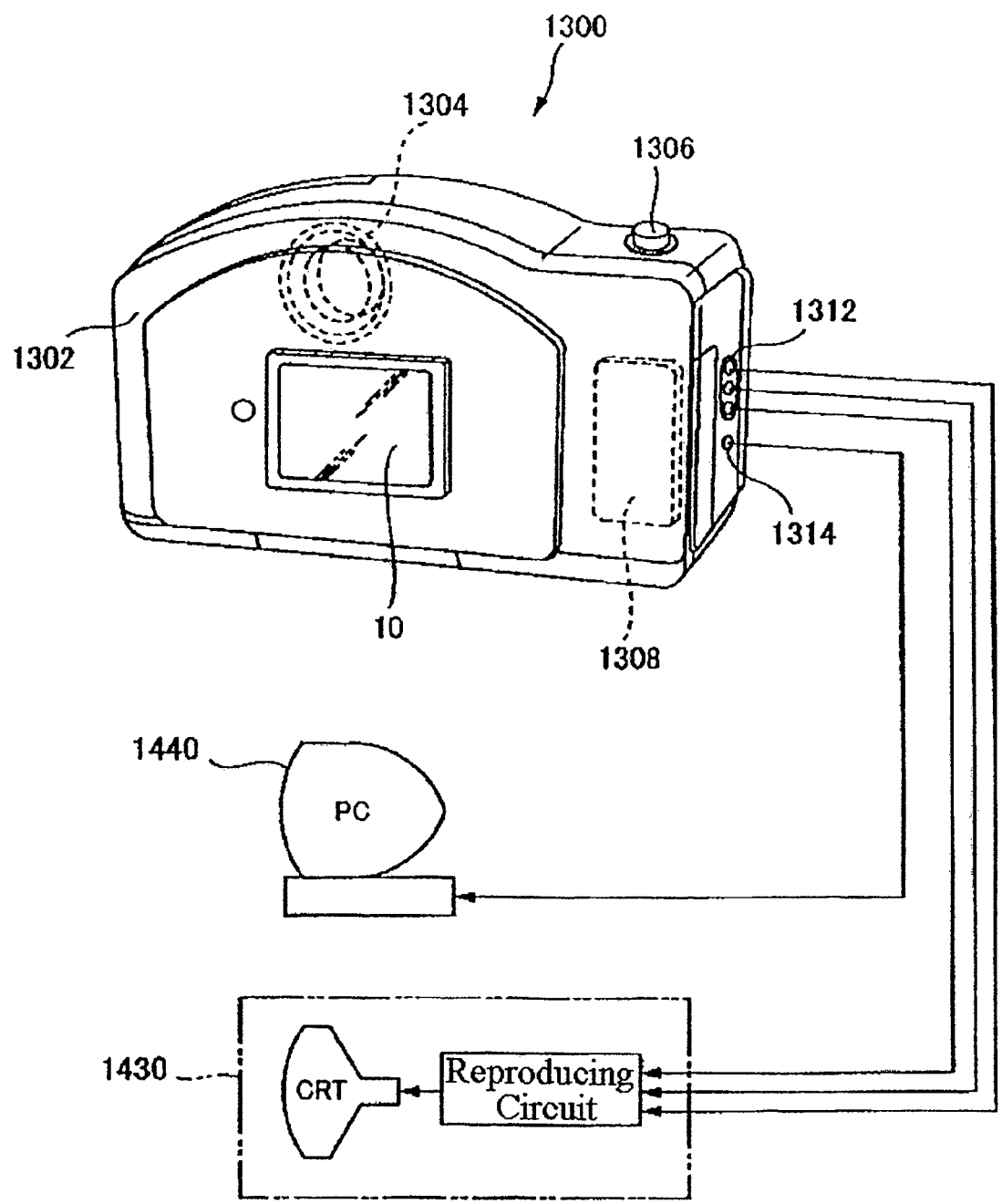
FIG. 9 is a perspective view which shows a structure of a digital still camera to which an electronic apparatus of the present invention is applied.

FIG. 9 is a perspective view which shows a structure of a digital still camera to which an electronic apparatus of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

The liquid crystal display 10 described above is provided as a display portion on the back surface of a case (body) 1302 in the digital still camera 1300. The liquid crystal display 10 displays an image in response to an imaging signal by the CCD, and serves as a finder for displaying a subject as an electronic image. A circuit board 1308 is placed inside the case 1302. A memory capable of storing an imaging signal is placed on the circuit board 1308.

Further, a light receiving unit 1304 including an optical lens (imaging optical system), the CCD, and the like is provided in the front surface side of the case 1302. When a photographer confirms an image of a subject displayed on the display portion, and pushes a shutter button 1306, an imaging signal of the CCD at the time is transferred to the memory of the circuit board 1308 and stored in this memory.

Further, a video signal output terminal 1312 and a input/output terminal 1314 for data communication are provided on the side surface of the case 1302 in the digital still camera 1300. As shown in FIG. 9, a television monitor 1430 and a personal computer 1440 are respectively connected to the video signal output terminal 1312 and the input/output terminal 1314 for data communication if needed. Moreover, the imaging signal stored in the memory of the circuit board 1308 is outputted to the television monitor 1430 or the personal computer 1440 with a predetermined operation.

In this regard, the electronic apparatus of the present invention can be suitably used in (or applied to), for example, televisions, video cameras, view finder type or monitor direct view type videotape recorders, laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, apparatuses with touch panel (for example, cash dispensers in a financial institutions, automatic ticket vending machines), medical devices (electronic thermometers, blood pressure meters, blood sugar meters, electrocardiogram displaying devices, ultrasound diagnostic devices, displays for endoscopes, for example), fish finders, various measurement devices, gauges (gauges for vehicles, airplanes, ships and the like, for example), flight simulators, any other types of monitors, projection type displays such as projectors and the like, in addition to the personal computer (mobile personal computer) 1100 shown in FIG. 7, the portable phone 1200 shown in FIG. 8 and the digital still camera 1300 shown in FIG. 9.

The semiconductor device, the electronic device, and the electronic apparatus according to the present invention have been described based on the embodiment shown in the drawings, but it should be noted that the present invention is not limited to the embodiment. Respective portions of the semiconductor device, the electronic device, and the electronic apparatus can be replaced with an arbitrary arrangement capable of functioning in the same manner. Further, any other arbitrary component may be added to the semiconductor device, the electronic device, and the electronic apparatus of the present invention.

EXAMPLE

Next, a concrete example of the present invention will be described.

1. Manufacturing and Evaluation of Insulating Film 1-1. Manufacturing of Insulating Film Two insulating films were formed in each of Examples 1 to 6 and Comparative Examples 1 to 5 that will be described below.

Example 1

-1A- A surface direction (100) p-type silicon crystal substrate (Si(100) substrate) was first prepared. The silicon crystal substrate was subject to a thermal oxidation process, and then a silicon oxynitride film (foundation layer) was formed with a CVD method. The thermal oxidation process was carried out in the atmosphere of water vapor ($H_2O$) having relative humidity of 33% RH at 750° C. The average thickness of the obtained silicon oxide film was 4.2 nm.

-2A- Next, this silicon oxide film was subject to heat treatment that was carried out in the degree of vacuum of $10^{-7}$ Pa at heating rate of 60° C. per minutes from 80° C. to 1000° C. By carrying out the steps as described above an insulating film was obtained.

Example 2

By carrying out the steps as well as Example 1 described above except for the atmosphere of heavy water vapor ($D_2O$) in place of the atmosphere of water vapor ($H_2O$) in the step -1A- described above, an insulating film having an average thickness of 3.8 nm was obtained.

Example 3

-1- A surface direction (100) p-type silicon crystal substrate (Si(100) substrate) was first prepared. The silicon crystal substrate was subject to a thermal oxidation process, and then a silicon oxynitride film (foundation layer) was formed with a CVD method. The thermal oxidation process was carried out in the atmosphere of water vapor ($H_2O$) having relative humidity of 33% RH at 750° C. Further, the CVD method was carried out for 40 minutes at 650° C. when the pressure in a chamber was 0.02 Pa and a gas of dichlorosilane ammonia was continually supplied into the chamber. The average thickness of the obtained silicon oxynitride film was 3.7 nm.

-2B- Next, this silicon oxynitride film was subject to heat treatment that was carried out in the atmosphere of water vapor ($H_2O$) having relative humidity of 95% RH at 900° C. for five minutes. By carrying out the steps as described above, an insulating film was obtained.

Example 4

-1C- A surface direction (100) p-type silicon crystal substrate (Si(100) substrate) was first prepared. The silicon crystal substrate was subject to a thermal oxidation process, and then a silicon oxynitride film (foundation layer) was formed with a CVD method. The average, thickness of the obtained silicon oxynitride film was 1.0 nm. In this regard, a leakage current in this silicon oxynitride film was extremely high ($1\times10^{-5}$ A/cm$^2$ or more) when a voltage (applied voltage) was applied to the silicon oxynitride film so that the electric field intensity in the silicon oxynitride film was in the range of 5 to 10 MV/cm.

-2C- Next, a hafnium silicate film was formed on this silicon oxynitride film with a CVD method. The average thickness of the obtained hafnium silicate film was 3.6 nm.

-3C- Next, this hafnium silicate film was subject to heat treatment that was carried out in the atmosphere of water vapor ($H_2O$) having relative humidity of 95% RH at 900° C. for five minutes. By carrying out the steps as described above, an insulating film was obtained.

Example 5

By carrying out the steps as well as Example 4 described above except to form a zirconium silicate film with the CVD method in the step -2C- described above, an insulating film having an average thickness of 3.9 nm was obtained.

Example 6

By carrying out the steps as well as Example 4 described above except to form an aluminum silicate film with the CVD method in the step -2C- described above, an insulating film having an average thickness of 4.1 nm was obtained.

Comparative Example 1

By carrying out the steps as well as Example 1 described above except to omit the step -2A- described above, an insulating film having an average thickness of 3.8 nm was obtained.

Comparative Example 2

By carrying out the steps as well as Example 3 described above except to omit the step -2B- described above, an insulating film having an average thickness of 3.8 nm was obtained.

Comparative Example 3

By carrying out the steps as well as Example 4 described above except to omit the step -3C- described above, an insulating film having an average thickness of 4.0 nm was obtained.

Comparative Example 4

By carrying out the steps as well as Example 5 described above except to omit the step -3C- described above, an insulating film having an average thickness of 3.6 nm was obtained.

Comparative Example 5

By carrying out the steps as well as Example 6 described above except to omit the step -3C- described above, an insulating film having an average thickness of 3.9 nm was obtained.

1-2. Evaluation for Insulating Film 1-2-1. Measurement of Infrared Absorbing Spectrum The absorption of infrared radiation was measured with a multi-reflection attenuated total reflection (ATR) method (infrared spectroscopy) with respect to each of Examples 1 to 6 and Comparative Examples 1 to 5. In this case, the measurement conditions of the multi-reflection ATR method were as follows.

| | |
|---|---|
| FTIR apparatus: | IFS-120HR (made by Bruker) |
| light source: | SiC |
| detector: | MCT |
| beam splitter: | Ge/KBr |
| resolution | 4 cm$^{-1}$ |
| attachments: | attachment for multi-reflection ATR measurement (made by Wilkes) |
| prism: | Ge |
| incident angle: | 60° |
| polarization | P polarization |

Figure 10:
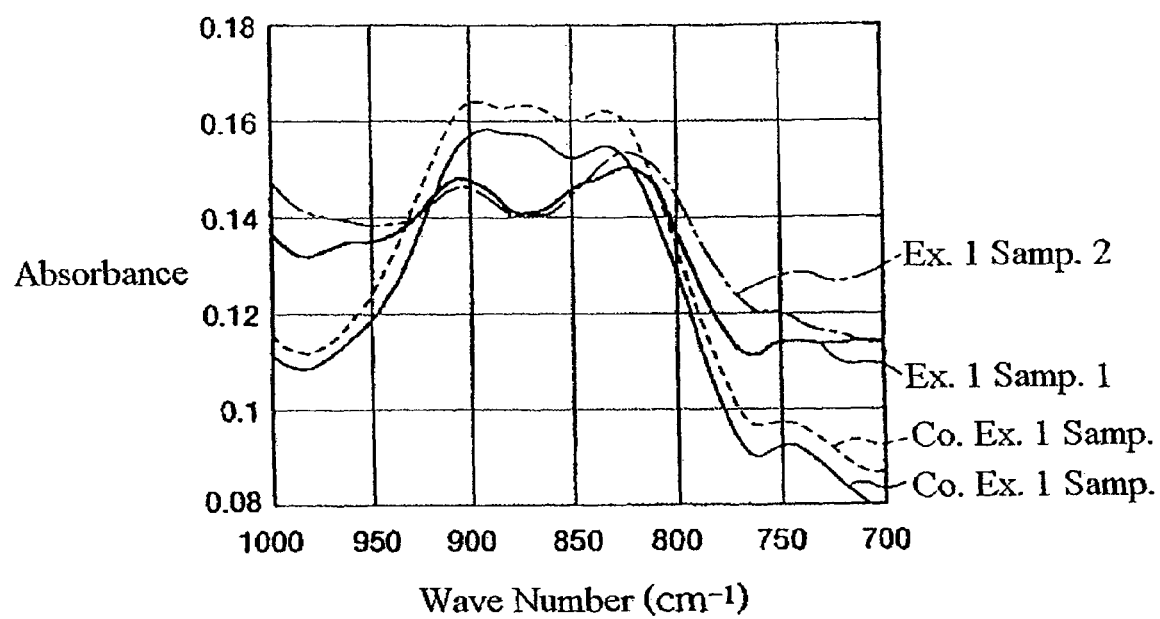
FIG. 10 is a drawing which shows an infrared absorption spectrum obtained from each of insulating films of Example 1 and Comparative Example 1.

The value A/B described above in the insulating films obtained in each of Examples 1 to 6 and Comparative Examples 1 to 5 is shown in TABLE 1 described below. In this regard, each of the numerical values in TABLE 1 is an average value of two different samples of insulating film. As an example the infrared absorption spectra (the relationship between the absorbance and the wave number of the infrared radiation) obtained from the insulating films of Example 1 and Comparative Example 1 are shown in FIG. 10. FIG. 10 is a drawing which shows an infrared absorption spectrum obtained from each of insulating films of Example 1 and Comparative Example 1.

TABLE 1

|  | Insulating Film | A/B |
|---|---|---|
| Ex. 1 | silicon oxide film | 2.49 |
| Ex. 2 | silicon oxide film (deuterated) | 6.26 |
| Ex. 3 | silicon oxynitride film | 6.82 |
| Ex. 4 | hafnium silicate film | 2.43 |
| Ex. 5 | zirconium silicate film | 2.15 |
| Ex. 6 | aluminum silicate film | 2.41 |
| Co-Ex. 1 | silicon oxide film | 1.24 |
| Co-Ex. 2 | silicon oxynitride film | 1.55 |
| Co-Ex. 3 | hafnium silicate film | 0.95 |
| Co-Ex. 4 | zirconium silicate film | 0.90 |
| Co-Ex. 5 | aluminum silicate film | 0.88 |

As shown in TABLE 1 and FIG. 10, the value A/B of the insulating film in each of Examples 1 to 6 is 1.8 or more. On the other hand, the value A/B of the insulating film in each of Comparative Examples 1 to 5 greatly falls below 1.8.

1-2-2. Measurement of Leakage Start Voltage

Next, a leakage start voltage was measured with respect to each of Examples 1 to 6 and Comparative Examples 1 to 5 when the electric field intensity (that is, the applied voltage value) to each insulating film was changed.

The voltage values at which leakage current start to flow when the voltage is applied to each of Examples 1 to 6 and Comparative Examples 1 to 5 while being changed in the range of 0 to 5 V are shown in TABLE 2. In this regard, each of the numerical values in TABLE 1 was an average value of the two insulating films. As an example, the change in the electric field intensity (applied voltage value) and the change in the leakage current value measured in the insulating films of Example 1 and Comparative Example 1 are shown in FIG. 11.

TABLE 2

|  | Insulating Film | Leakage Start Voltage (V) |
|---|---|---|
| Ex. 1 | silicon oxide film | 2.6 |
| Ex. 2 | silicon oxide film (deuterated) | 2.7 |
| Ex. 3 | silicon oxynitride film | 3.0 |
| Ex. 4 | hafnium silicate film | 2.6 |
| Ex. 5 | zirconium silicate film | 2.4 |
| Ex. 6 | aluminum silicate film | 2.4 |
| Co-Ex. 1 | silicon oxide film. | 0.7 |
| Co-Ex. 2 | silicon oxynitride film | 0.9 |
| Co-Ex. 3 | hafnium silicate film | 0.6 |
| Co-Ex. 4 | zirconium silicate film | 0.5 |
| Co-Ex. 5 | aluminum silicate film | 0.4 |

Figure 11:
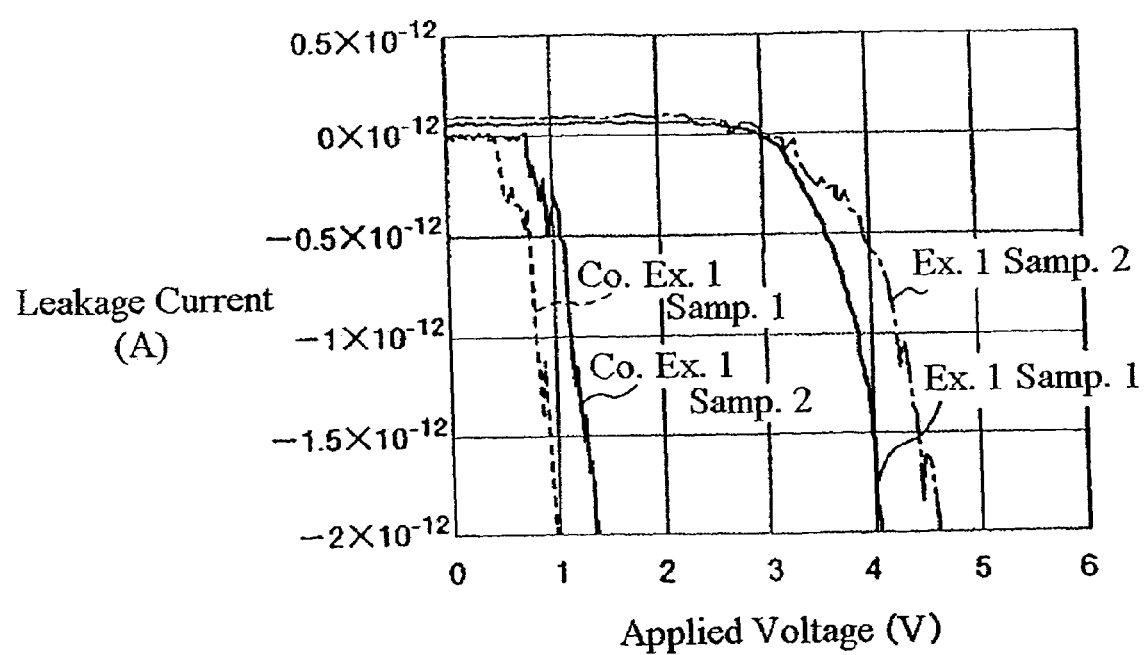
FIG. 11 is a graph which shows a relationship between a change in electric field intensity and a change in a leakage current both measured in the insulating films of Example 1 and Comparative Example 1.

As shown in TABLE 2 and FIG. 11, the leakage current started to flow in the insulating film of each of Examples 1 to 6 at the high applied voltage (in this case, 2.4 V or more). On the other hand, the leakage current started to flow in the insulating film 1 of each of Comparative Examples 1 to 5 at the lower applied voltage (in this case, 0.7 V or less).

1-2-3. Measurement of Leakage Current

Next, changes in the leakage current values was measured with respect to each, of Examples 1 to 6 and Comparative Examples 1 to 5 when the electric field intensity (that is, the applied voltage value) to each insulating film was changed. In this case, the measured area was determined to be 0.02039 cm$^2$.

The maximum values of the leakage current measured when the electric field intensity was in the range of 0 to −5 MV/cm in the insulating films obtained in each of Examples 1 to 6 and Comparative Examples 1 to 5 are shown in TABLE 3 described below. In this regard, each of the numerical values in TABLE 3 is an average value of the two insulating films.

TABLE 3

|  | Insulating Film | Maximum Value of Leakage Current (A/cm$^2$) |
|---|---|---|
| Ex. 1 | silicon oxide film | $3 \times 10^{-9}$ |
| Ex. 2 | silicon oxide film (deuterated) | $2 \times 10^{-9}$ |
| Ex. 3 | silicon oxynitride film | $1 \times 10^{-9}$ |
| Ex. 4 | hafnium silicate film | $4 \times 10^{-9}$ |
| Ex. 5 | zirconium silicate film | $5 \times 10^{-9}$ |
| Ex. 6 | aluminum silicate film | $4 \times 10^{-9}$ |
| Co-Ex. 1 | silicon oxide film | $2 \times 10^{-8}$ |
| Co-Ex. 2 | silicon oxynitride film | $1 \times 10^{-8}$ |
| Co-Ex. 3 | hafnium silicate film | $3 \times 10^{-8}$ |
| Co-Ex. 4 | zirconium silicate film | $4 \times 10^{-8}$ |
| Co-Ex. 5 | aluminum silicate film | $4 \times 10^{-8}$ |

The leakage current value in the insulating film of each of Examples 1 to 6 when the electric field intensity was in the range of 0 to −10 MV/cm (in particular, in the range of 0 to −5 MV/cm as shown in TABLE 3) was restricted to low value. On the other hand, in the insulating film of each of Comparative Examples 1 to 5, a large leakage current flowed even at lower electric field intensity.

1-2-4. Measurement of Qbd Value

Next, the Qbd value was measured with respect to the insulating film of each of Examples 1 to 6 and Comparative Examples 1 to 5. Here, the "Qbd value" means total electrical charges (that is, total amount of current) which flows in the insulating film in the thickness direction thereof when a dielectric breakdown occurs. The larger the Qbd value is, the more difficultly a dielectric breakdown occurs. In this measurement of the Qbd value, when a constant current is supplied to an insulating film using mercury electrodes, a time point when a small change in voltage occurs first time is determined to be the SBD, and a time point when a drastic change in voltage occurs is determined to be the HBD. Total electrical charges (Qbd value (SBD)) that pass through the insulating film until a SBD occurs and total electrical charges (Qbd value (HBD)) that pass through the insulating film until a HBD occurs were measured. In this case, the measured area was determined to be 0.02039 cm$^2$, and a constant current value applied to the insulating film was determined to be 0.01226 A/cm$^2$.

The Qbd value (SBD) and the Qbd value (HBD) thus measured in the insulating film of each of Examples 1 to 6 and Comparative Examples 1 to 5 are shown in TABLE 4 described below. In this regard, the numerical values in TABLE 4 is an average value of the two insulating films.

TABLE 4

|  |  | Qbd value (C/cm$^2$) | |
|---|---|---|---|
|  | Insulating Film | SBD | HBD |
| Ex. 1 | silicon oxide film | 83 | 265 |
| Ex. 2 | silicon oxide film (deuterated) | 86 | 325 |
| Ex. 3 | silicon oxynitride film | 89 | 347 |
| Ex. 4 | hafnium silicate film | 81 | 256 |
| Ex. 5 | zirconium silicate film | 76 | 223 |
| Ex. 6 | aluminum silicate film | 79 | 243 |
| Co-Ex. 1 | Silicon oxide film | 15 | 43 |

TABLE 4-continued

| | Insulating Film | Qbd value (C/cm$^2$) | |
|---|---|---|---|
| | | SBD | HBD |
| Co-Ex. 2 | silicon oxynitride film | 17 | 46 |
| Co-Ex. 3 | hafnium silicate film | 12 | 35 |
| Co-Ex. 4 | zirconium silicate film | 10 | 29 |
| Co-Ex. 5 | aluminum silicate film | 7 | 26 |

As shown in TABLE 4, the Qbd value (SBD) of the insulating film in each of Examples 1 to 6 was larger than the Qbd value (SBD) of the insulating film in each of Comparative Examples 1 to 5. Further, the Qbd value (HBD) of the insulating film in each of Examples 1 to 6 was larger than the Qbd value (HBD) of the insulating film in each of Comparative Examples 1 to 5 as well as the Qbd value (SBD).

From each of evaluation results described above, it is apparent that the insulating film in which A and B satisfy the relation: the value A/B is 1.8 or more) has superior resistance to a dielectric breakdown. Further, the tendency that the resistance to a dielectric breakdown of the insulating film is improved as the value A/B becomes larger is shown.

2. Manufacturing and Evaluation of Semiconductor Device 2-1. Manufacturing of Semiconductor Device The semiconductor device shown in FIG. 1 was manufactured in accordance with the method described in the above embodiment. In this case, the gate insulating film was formed as well as each of Examples 1 to 6 and Comparative Examples 1 to 5 described above.

2-2. Evaluation for Semiconductor Device

The switching characteristics of each semiconductor device were examined. As a result, good switching characteristics were obtained for a long time in the semiconductor device including each of the gate insulating films formed in the same manner as Examples 1 to 6. On the other hand, in the semiconductor device including each of the gate insulating films formed in the same manner as Comparative Examples 1 to 5, a leakage current was recognized and the switching characteristics were unstable. Thus, a dielectric breakdown occurred in the gate insulating film early, and a function as a switching device was lost.

What is claimed is:

1. A method for forming a gate insulation film for use in a semiconductor device, the semiconductor device including a semiconductor substrate having a source region, a drain region, a channel region provided between the source region and the drain region and an element separate structure surrounding the source region, the drain region and the channel region, the gate insulation film being provided so as to cover the semiconductor substrate, and a gate electrode provided so as to face the channel region via the gate insulation film, and wherein the gate insulation film is formed of an insulative inorganic material as a main material, the insulative inorganic material containing silicon and oxygen, the gate insulating film further containing hydrogen atoms, the method comprising:

preparing the semiconductor substrate;
forming the element separate structure so as to compartmentalize one surface of the semiconductor substrate into a plurality of regions;
forming the gate insulation film so as to cover the semiconductor substrate and the element separate structure;
subjecting the gate insulation film to which an electric field has never been applied to Fourier Transform Infrared Spectroscopy at room temperature after formation of the gate insulation film on the semiconductor substrate and the element separate structure; and
evaluating the gate insulation film characteristic based on measurement results of the gate insulation film by the Fourier Transform Infrared Spectroscopy, the characteristic being evaluated as to whether the following conditions (1) and (2) are satisfied; (1) at least a part of the absorbance of infrared radiation has a wave number in the range of 830 to 900 cm$^{-1}$, and
(2) in the case where an absolute value of a difference between absorbance of infrared radiation at a wave number of 830 cm$^{-1}$ and the absorbance of infrared radiation at a wave number of 770 cm$^{-1}$ is defined as A and an absolute value of a difference between absorbance of infrared radiation at a wave number of 900 cm$^{-1}$ and absorbance of infrared radiation at a wave number of 990 cm$^{-1}$ is defined as B, then A and B satisfy a following relation: A/B is 1.8 or more.

2. The method as claimed in claim 1, wherein the insulative inorganic material further includes at least one of nitrogen, hafnium, zirconium, and aluminum in addition to silicon and oxygen.

3. The method as claimed in claim 1, wherein each hydrogen atom in at least a part of the hydrogen atoms is replaced by a deuterium atom.

4. The method as claimed in claim 1, wherein an average thickness of the gate insulating film is 10 nm or less.

5. The method as claimed in claim 1, wherein the semiconductor device is adapted to be used under the condition that a gate voltage is applied to the gate electrode so that an electric field intensity in the gate insulating film is 10 MV/cm or less.

6. The method as claimed in claim 5, wherein a leakage current passing through the gate insulation film in the thickness direction thereof that is measured in a state that the gate voltage is applied to the gate electrode so that the electric field intensity in the gate insulation film is 5 MV/cm or less is $9 \times 10^{-9}$ A/cm$^2$ or less.

7. The method as claimed in claim 1, wherein the total amount of electrical charges passing through the gate insulation film in the thickness direction thereof until a soft breakdown occurs in the gate insulation film is 40 C/cm$^2$ or more.

8. The method as claimed in claim 1, wherein the total amount of electrical charges passing through the gate insulation film in the thickness direction thereof until a hard breakdown occurs in the gate insulation film is 100 C/cm$^2$ or more.

9. The method as claimed in claim 1, wherein the Fourier Transform Infrared Spectroscopy is a Multi-Reflection Attenuated Total Reflection Method.

* * * * *